(12) United States Patent
Earney et al.

(10) Patent No.: US 10,688,488 B2
(45) Date of Patent: Jun. 23, 2020

(54) FLUIDIC DEVICES AND METHODS OF MANUFACTURING THE SAME

(71) Applicant: Illumina, Inc., San Diego, CA (US)

(72) Inventors: John Gerhardt Earney, San Diego, CA (US); Justin Fullerton, San Diego, CA (US); Kaleb Smith, Oceanside, CA (US); Bala Murali K. Venkatesan, San Francisco, CA (US)

(73) Assignee: ILLUMINA, INC., San Diego, CA (US)

( * ) Notice: Subject to any disclaimer, the term of this patent is extended or adjusted under 35 U.S.C. 154(b) by 379 days.

(21) Appl. No.: 15/839,509

(22) Filed: Dec. 12, 2017

(65) Prior Publication Data

US 2018/0214869 A1 Aug. 2, 2018

Related U.S. Application Data

(60) Provisional application No. 62/452,923, filed on Jan. 31, 2017.

(51) Int. Cl.
*B01L 3/00* (2006.01)
*B01J 19/00* (2006.01)
(Continued)

(52) U.S. Cl.
CPC ..... *B01L 3/502707* (2013.01); *B01J 19/0093* (2013.01); *B01L 3/50273* (2013.01);
(Continued)

(58) Field of Classification Search
CPC .......... B01J 19/0093; B01L 2200/0684; B01L 2200/0689; B01L 2200/12;
(Continued)

(56) References Cited

U.S. PATENT DOCUMENTS

2002/0176804 A1* 11/2002 Strand .................. B01J 19/0093
422/400
2003/0137630 A1 7/2003 Niiya et al.
(Continued)

FOREIGN PATENT DOCUMENTS

RU 2478431 4/2013
WO 2009077913 6/2009
(Continued)

OTHER PUBLICATIONS

PCT/US2017/065855, "International Search Report and Written Opinion dated Mar. 30, 2018," 15 pages.

*Primary Examiner* — Jennifer Wecker
(74) *Attorney, Agent, or Firm* — Illumina, Inc.

(57) ABSTRACT

An example method includes providing a working stack having a first substrate layer, a second substrate layer, and a radiation-absorbing material disposed between the first and second substrate layers. The working stack includes a cavity therein having a designated liquid. A bonding interface is defined between the radiation-absorbing material and at least one of the first substrate layer or the second substrate layer. The bonding interface has a film of the designated liquid. The method also includes directing radiation onto the bonding interface to form a perimeter seal. The perimeter seal separates the cavity from an outer area of the bonding interface. The method also includes directing the radiation onto the outer area of the bonding interface to secure the first and second substrate layers together. The perimeter seal impedes an ingress of bubbles from the outer area into the cavity as the radiation is directed onto the outer area.

22 Claims, 11 Drawing Sheets

(51) Int. Cl.
| | |
|---|---|
| *G02B 26/00* | (2006.01) |
| *B33Y 50/02* | (2015.01) |
| *G01N 27/447* | (2006.01) |
| *G02B 3/14* | (2006.01) |
| *F16J 15/14* | (2006.01) |
| *B81C 1/00* | (2006.01) |
| *B81C 3/00* | (2006.01) |
| *F16J 15/10* | (2006.01) |
| *B29C 65/00* | (2006.01) |
| *B29C 65/16* | (2006.01) |
| *B29C 65/48* | (2006.01) |
| *B29C 35/08* | (2006.01) |
| *B29L 31/00* | (2006.01) |
| *B29C 65/50* | (2006.01) |

(52) U.S. Cl.
CPC ......... *B01L 3/502738* (2013.01); *B33Y 50/02* (2014.12); *B81C 1/00269* (2013.01); *B81C 3/001* (2013.01); *F16J 15/108* (2013.01); *F16J 15/14* (2013.01); *G01N 27/44791* (2013.01); *G02B 3/14* (2013.01); *G02B 26/005* (2013.01); *B01L 2200/0684* (2013.01); *B01L 2200/0689* (2013.01); *B01L 2200/12* (2013.01); *B01L 2300/0645* (2013.01); *B01L 2300/0887* (2013.01); *B01L 2300/123* (2013.01); *B01L 2300/1827* (2013.01); *B01L 2400/0439* (2013.01); *B01L 2400/0487* (2013.01); *B01L 2400/0655* (2013.01); *B29C 65/168* (2013.01); *B29C 65/1635* (2013.01); *B29C 65/1654* (2013.01); *B29C 65/1683* (2013.01); *B29C 65/4815* (2013.01); *B29C 65/5057* (2013.01); *B29C 66/1122* (2013.01); *B29C 66/53461* (2013.01); *B29C 2035/0838* (2013.01); *B29L 2031/756* (2013.01); *B81B 2201/047* (2013.01); *B81B 2201/058* (2013.01)

(58) Field of Classification Search
CPC ..... B01L 2300/0645; B01L 2300/0887; B01L 2300/123; B01L 2300/1827; B01L 2400/0439; B01L 2400/0487; B01L 2400/0655; B01L 3/502707; B01L 3/50273; B01L 3/502738; B29C 2035/0838; B29C 65/1635; B29C 65/1654; B29C 65/168; B29C 65/1683; B29C 65/4815; B29C 65/5057; B29C 66/1122; B29C 66/53461; B29L 2031/756; B33Y 50/02; B81B 2201/047; B81B 2201/054; B81B 2201/058; B81C 1/00269; B81C 2203/037; B81C 3/001; F16J 15/108; F16J 15/14; G01N 27/44791; G02B 26/005; G02B 3/14
See application file for complete search history.

(56) References Cited

U.S. PATENT DOCUMENTS

| | | | |
|---|---|---|---|
| 2011/0157679 A1* | 6/2011 | Fike, III | B32B 37/003 |
| | | | 359/290 |
| 2012/0051523 A1 | 3/2012 | Feke | |
| 2014/0335301 A1 | 11/2014 | Van 'T Oever et al. | |
| 2016/0002320 A1 | 1/2016 | Fisher et al. | |
| 2016/0268541 A1* | 9/2016 | Dabich, II | B23K 26/206 |

FOREIGN PATENT DOCUMENTS

| | | |
|---|---|---|
| WO | 2012/087369 A1 | 6/2012 |
| WO | 2012/140873 | 10/2012 |

\* cited by examiner

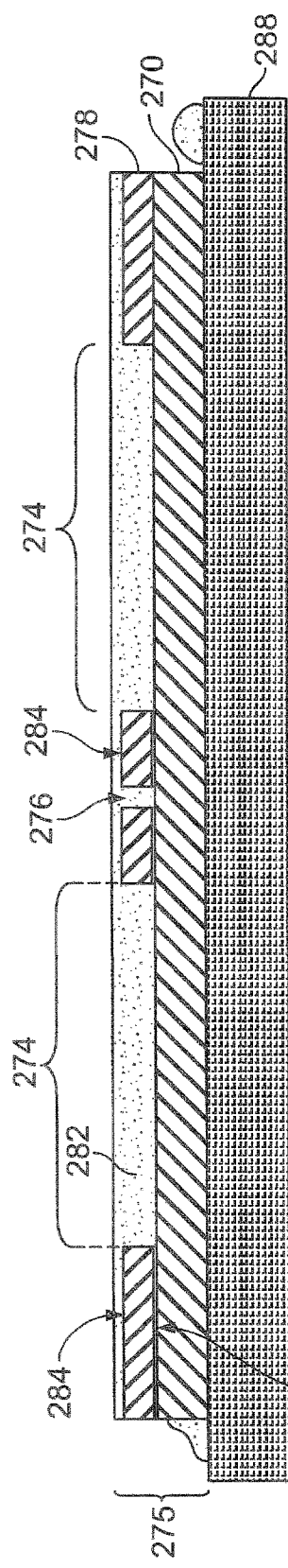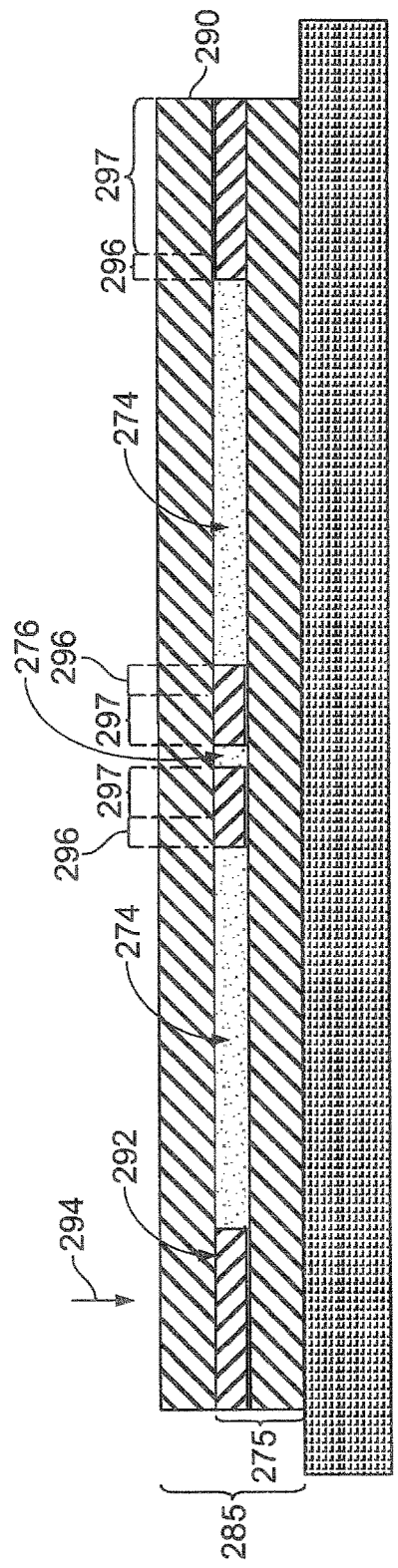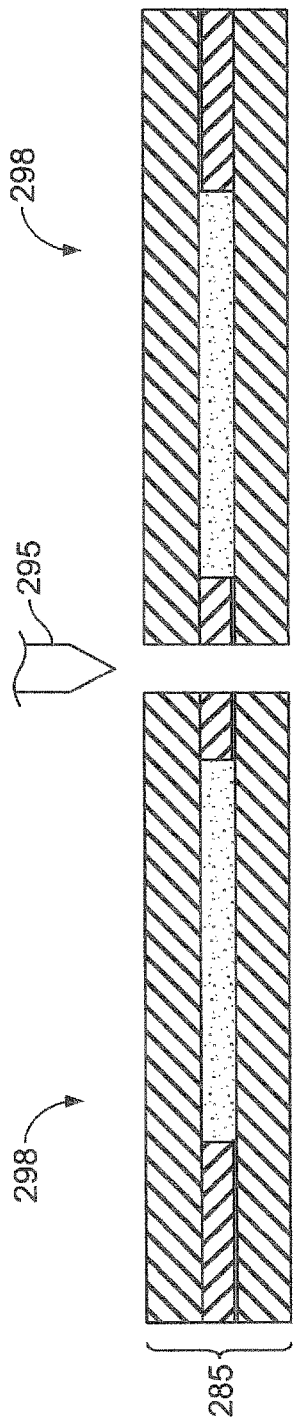

FLUIDIC DEVICES AND METHODS OF MANUFACTURING THE SAME

CROSS-REFERENCE TO RELATED APPLICATIONS

This application claims the benefit of U.S. Provisional Application Ser. No. 62/452,923, filed Jan. 31, 2017, which is incorporated by reference herein in its entirety.

BACKGROUND

Various industries use devices that hold a liquid or allow a liquid to pass therethrough. Such devices have widespread use in biotechnology, optoelectronics, and micro-electromechanical systems (MEMS). As one example, systems for biological research may use fluidic devices called flow cells to conduct designated reactions within flow channels. The reactions (or evidence of the reactions) are imaged by a camera sub-system having an objective lens that is positioned adjacent to the flow cell. To calibrate the camera sub-system, another device is positioned where the flow cell is typically located. This other device is an optical alignment tool that appears similar to the flow cell. The optical alignment tool has an enclosed chamber that is similar to the flow channels in size and shape. The enclosed chamber is filled with a liquid that includes one or more fluorescent dyes. An interior surface that defines the enclosed chamber has metal pads with shaped openings therethrough. To align the camera sub-system, the metal pads are imaged by exciting the fluorescent dye(s) in the enclosed chamber. The shaped openings of the metal pads in the images are analyzed to determine how to align the camera sub-system.

Fluidic devices, such as the flow cells and the optical alignment tool described above, may include multiple discrete structures that are secured to one another. It becomes more challenging, however, to join these structures when features of the structures become smaller or the designs of the structures become more complex. One technique used to join the structures is referred to as "laser-welding" or "laser-bonding" in which a light beam (e.g., laser beam) is directed along the interface between two adjacent structures causing the material of at least one of the structures to melt. A weld is formed after the material cools and solidifies.

A common problem that may occur with fluidic devices is that the liquid may leak through the interfaces or through ports of the fluidic devices. In addition to this, it is often desirable for bubbles to be absent (or near absent) from the cavities where the liquid is located. Bubbles may reduce the quality of images or prevent certain mechanisms, such as liquid valves and lenses, from operating properly. Although laser-welding is effective in joining the structures, it is still challenging to create devices that limit leakage and/or that have a reduced number of bubbles.

DEFINITIONS

As used herein, the following terms have the meanings indicated.

A "substrate layer" is a layer that is capable of being coupled to another layer (e.g., another substrate layer), and laser welded (or laser bonded) to the other layer. The substrate layers may include or be an inorganic solid, an organic solid, or a combination thereof. Examples of an inorganic solid material include glass and modified or functionalized glass, ceramics, silica or silica-based materials, including silicon and modified silicon, and metals. Examples of organic solid materials include plastics, such as thermoplastics and thermosets, including nylon, cyclic olefin copolymers (e.g., ZEONOR® products from Zeon), cyclic olefin polymers, carbon fiber, and polymers. Example thermoplastics include polyacrylate, polyamide, polyimide (e.g., KAPTON® products from E.I. du Pont de Nemours and Co. (Du Pont)), polybutylene terephthalate, polycarbonate, polyether ketone, polyethylene, polyphenylene sulfide, polyacetal, polypropylene, polystyrene, polysulfone, polyvinyl butyral and polyvinyl chloride. Examples of thermoplastics that may be suitable include KAPTON® KJ and black KAPTON® KJ.

It should be understood that the term "substrate layer" is not limited to a single continuous body of the same material, unless otherwise explicitly stated. For example, a substrate layer may be formed from multiple sub-layers of the same or different materials. Moreover, each substrate layer may include one or more elements located therein that comprise different materials. For example, a substrate layer may include electrodes or conductive traces in addition to a base substrate material, such as glass or thermoplastic. Optionally, a substrate layer may be secured to other elements or components prior to the substrate layer being welded to another substrate layer.

A "radiation-absorbing material" is a material that absorbs radiation within a designated region or range of the electromagnetic spectrum. The radiation-absorbing material may be or may not be part of a substrate layer that is secured to another substrate layer through laser-welding. Radiation-absorbing material may be in the form of organic solids, such as the organic solids described above. For example, polyimide film, such as a KAPTON® (DuPont) film, may absorb radiation at wavelengths below 650 nm such that the polyimide film is melted. A laser beam in which the light has a sufficient wavelength (e.g., 480 nm) may be directed to the polyimide polymers of the film.

A substrate layer may be impregnated with a radiation-absorbing material. For example, an organic solid can be impregnated with a dye or with carbon black, as is the case for black KAPTON® (carbon black-impregnated polyimide available from DuPont). A dye that is used can be matched to a particular laser according to overlap between the wavelength emitted by the laser and the absorption spectrum for the dye. Black KAPTON® can be activated (e.g., via heating) by a laser that emits at 1064 nm.

An organic solid may be configured to absorb radiation in any of a variety of regions of the spectrum including for example in the ultraviolet (UV) (e.g., extreme UV or near UV), visible (VIS) (e.g., red, orange, yellow, green, blue, indigo or violet), or infrared (IR) (e.g., near IR, mid IR or far IR) regions of the spectrum. It will be understood that an organic solid can be chosen based on absence of absorption in one or more of regions of the spectrum, including for example, one or more of the aforementioned regions. The inorganic solid may transmit radiation in at least part of the spectrum that is absorbed by the organic solid.

A "solid layer" refers to a substrate that is insoluble in aqueous liquid. The solid layer can be non-porous or porous. The solid layer can be rigid or flexible. A non-porous solid generally provides a seal against bulk flow of liquids or gases. Exemplary solid layers include glass and modified or functionalized glass, plastics (including acrylics, polystyrene and copolymers of styrene and other materials, polypropylene, polyethylene, polybutylene, polyurethanes, TEFLON™ (DuPont), cyclic olefins, cyclo-olefin polymers (COP) (e.g., ZEONOR®), polyimides, etc.), nylon, ceramics, resins, silica or silica-based materials including silicon and modified silicon, carbon, metals, inorganic glasses, and polymers, including synthetic polymers. Particularly useful solids for some examples of the solid layer have at least one surface located within a flow cell apparatus.

Optionally, a chemically reactive layer (or sub-layer) may be present between two other layers during a bonding step. A "chemically reactive layer" refers to a surface coating or region between surfaces that contains at least one moiety that is capable of becoming covalently modified or covalently attached to at least one other moiety upon physical or chemical stimulation. In some examples, an interface can be occupied by a liquid, gas, solid, or plasma that contains the reactive moiety.

The chemically reactive layer can be a coating on either or both of the two other layers. Alternatively, the chemically reactive layer can be present in or on an intermediate material that is present between the two other layers such that the two other layers become attached via the intermediate material as a result of carrying out the fabrication method. Similarly, the chemically reactive layer can be a liquid layer containing cross-linking reagents that are reactive to, for example, both an organic layer and an inorganic layer.

A chemically reactive layer can be created on a solid layer using, for example, a silanization method. Techniques such as vapor phase deposition, dip coating, spin coating and spray coating can be used to silanize a surface. In some examples, such methods can be used to apply a silane coat across the entirety of a surface. However, it is also possible to create a silanization pattern on a surface, for example, using masking methods or precision spraying methods. For example, as set forth in further detail below it may be desirable to apply silane (or other chemically reactive moieties) selectively to regions on the surface of an inorganic layer that are to be bonded to an organic layer, while avoiding or minimizing silanization (or other chemical modification) of other regions of the inorganic layer where a bond to the organic layer is not wanted. If desired, the surface of an organic layer can be patterned with silane or other chemically reactive coating using similar techniques.

Examples of silanes that can be used include acrylate functional silanes, aldehyde functional silanes, amino functional silanes, anhydride functional silanes, azide functional silanes, carboxylate functional silanes, phosphonate functional silanes, sulfonate functional silanes, epoxy functional silanes, ester functional silanes, vinyl functional silanes, olefin functional silanes, halogen functional silanes and dipodal silanes with any or none of the above functional groups. The choice of silane functionality can be made based on the reactivity of the organic material to which it will react. For example, amino functional silanes react with thermoplastics such as polyacrylate, polyamide, polyamide-imide, polybutylene terephthalate, polycarbonate, polyether ketone, polyethylene, polyphenylene sulfide, polysulfone, polyvinyl butyral and polyvinyl chloride. Vinyl and olefin functional silanes react with thermoplastics such as polyacetal, polyethylene and polypropylene. Acrylate functional silanes react with thermoplastics such as polypropylene and polystyrene. A designated surface may be silanized to enhance the bonding between the designated surface and another surface to which the designated surface is to be bonded. For example, a radiation-absorbing material or layer may have a surface that is silanized. The silanized surface may be melted during the laser-bonding process.

A "working stack" includes multiple substrate layers coupled together, in which two adjacent layers form an interface. In some example, the working stack includes a radiation-absorbing material between the multiple substrate layers. The working stack may refer to the stack of layers at each stage of the assembly process.

The term "interface" refers to a region at the boundary of two materials. For example, the term can refer to an area between two solid layers, between a solid layer and a chemically reactive layer, between chemically reactive layers on two solid layers, between a bonding layer and a solid layer, etc. The term may include the surface of one or both of the materials that occur at the boundary.

A "bonding interface" refers to an interface that is welded to attach two discrete substrate layers to each other. For example, the bonding interface can include one or more covalent or non-covalent bonds that form the attachment. A covalent bond is characterized by the sharing of pairs of electrons between atoms. A chain of two or more covalent bonds can form a molecular link between two layers. Thus, the bonding interface can have a thickness of one or more covalent bond-lengths. In particular examples, each molecular link can span the bonding interface uninterrupted by any non-covalent bonds. Alternatively, a molecular link can include one or more non-covalent bonds in a chain of bonds that span the bonding interface. A non-covalent bond is a chemical bond that does not involve the sharing of pairs of electrons and can include, for example, hydrogen bonds, ionic bonds, van der Waals forces, hydrophilic interactions and hydrophobic interactions. In at least some examples, the bonding interface can include a combination of covalent molecular links that span the bonding interface and non-covalent linkages that span at least part of the bonding interface. Any of a variety of materials that join, fasten, adhere, connect or bind the layers can be included in a bonding interface.

A "cavity" refers to a space that is capable of containing a liquid. A cavity may be enclosed such that the cavity is surrounded, or a cavity may be open-sided. The cavity may be a channel or chamber. The term "channel" refers to an elongated passage that is configured to contain a liquid or direct the flow of a liquid in or on a solid layer. The channel may have one or more ports for entering and/or exiting the device. The channel may be open-sided. For example, the open-sided channel may be a groove, trench, straight, furrow or the like. The transverse cross-section of an open channel can be, for example, U-shaped, V-shaped, curved, angular, polygonal, or hyperbolic. Closed channels may be shaped as pipes, tubes, tunnels or the like. A closed channel can have a circular, elliptical, square, rectangular, or polygonal cross-section.

A "flexible membrane" is a membrane that is capable of having a local section displaced (e.g., through bending and/or stretching) when a force is applied to the local section of the flexible membrane. The flexible membrane may be a substrate layer as described herein. The local sections are surrounded by one or more outer sections. The local sections are displaced without breaking from outer sections while the outer sections are held in a fixed configuration. The local section of the flexible membrane may resist movement when a force is applied to the local section of the flexible membrane such that the resistance is proportional to an amount of the displacement/stretching of the local section of the flexible membrane. The local section of the flexible membrane may be moved from a first configuration (e.g., shape) to at least one second configuration that is more bent and/or stretched than the first configuration. In some examples, the first configuration may be the relaxed configuration of the local section of the flexible membrane when the force is not applied to the flexible membrane. In other examples, the first configuration may be the least bent and/or stretched configuration when only a smaller force is applied to the local section of the flexible membrane. When the local section of the flexible membrane is bent and/or stretched in a second configuration, a potential force exists in the flexible membrane for moving the local section of the flexible membrane back to the first configuration after the force is removed. Materials that may be used for flexible membranes include, for example, polyimide, polycarbonates, polyethylene terephthalate (PET), and polydimethylsiloxane (PDMS). Optionally, a surface of the flexible membrane may be silanized along the area that will be laser-welded to the other material. Optionally, a radiation-absorbing material may be applied to the flexible membrane.

"Compression" refers to forcing two objects together. For example, two substrate layers can be brought together by clamping the substrate layers to each other, pressing the two substrate layers together, placing one layer atop another in a gravitational field (e.g., under earth's gravity or centrifugally induced gravity), or the like.

INTRODUCTION

In an example, a method is provided that includes providing a working stack having a first substrate layer, a second substrate layer, and a radiation-absorbing material disposed between the first and second substrate layers. The working stack includes a cavity therein having a designated liquid. A bonding interface is defined between the radiation-absorbing material and at least one of the first substrate layer or the second substrate layer. The bonding interface has a film of the designated liquid. The method also includes directing radiation onto the bonding interface along a predetermined path to form a perimeter seal. The perimeter seal is positioned to separate the cavity from an outer area of the bonding interface. The method also includes directing the radiation onto the outer area of the bonding interface to secure the first and second substrate layers together. The perimeter seal impedes an ingress of bubbles from the outer area into the cavity as the radiation is directed onto the outer area.

In some aspects, providing the working stack may include positioning the radiation-absorbing material onto the first substrate layer. The radiation-absorbing material may be patterned to include an open-sided cavity. Providing the working stack may also include directing radiation onto a secondary interface between the first substrate layer and the radiation-absorbing material to secure the first substrate layer and the radiation-absorbing material to each other. Providing the working stack may also include filling the open-sided cavity with the designated liquid and stacking the second substrate layer with respect to the radiation-absorbing material and the first substrate layer, thereby covering the open-sided cavity and forming the cavity of the working stack. The film of the designated liquid may be present along the bonding interface as the second substrate layer covers the open-sided cavity.

In some aspects, directing the radiation onto the bonding interface to form the perimeter seal includes positioning the perimeter seal a distance away from the cavity such that a spacing exists between the perimeter seal and the cavity.

In some aspects, the working stack and the second substrate layer form at least a part of a device. The first substrate layer, the radiation-absorbing material, and second substrate layer may be continuous layers such that the device is devoid of ports that would permit flow of the designated liquid into or out of the cavity of the working stack.

In some aspects, providing the working stack includes forming a target layer along at least one of the first substrate layer or the second substrate layer. The target layer may include an opaque material located thereon in a designated pattern.

In some aspects, the radiation-absorbing material includes separate sections disposed between the first and second substrate layers and an exit channel between adjacent sections of the radiation-absorbing material. The exit channel may be in flow communication with at least one of an exterior of the working stack or a reservoir. The designated liquid and the bubbles may be permitted to enter the exit channel from the outer area of the bonding interface as the radiation is directed onto the outer area.

In some aspects, the working stack includes a plurality of the cavities. The method may also further include dicing the working stack after securing the first and second substrate layers to form a plurality of devices.

In some aspects, the cavity includes an imaging region and a gutter region that exists between the imaging region and the radiation-absorbing material. The imaging region may have a target to be imaged. The gutter region may be devoid of the target.

In some aspects, the radiation-absorbing material includes a transparent layer and an opaque layer. The opaque layer may absorb the radiation to form a composite joint.

In some aspects, a portion of the outer area that is irradiated to secure the first and second substrate layers together is at least ten times (10×) an area of the perimeter seal.

In some aspects, directing the radiation along the predetermined path to form the perimeter seal and directing the radiation onto the outer area are performed sequentially during a single radiation session in which the radiation is continuously applied. Directing the radiation onto the outer area may include directing a laser beam in a raster-like manner to cover the outer area.

It is to be understood that any features of the method may be combined together in any desirable manner and/or configuration.

In an example, a device is provided that includes a multi-layer stack having a substrate layer and a radiation-absorbing material disposed along the substrate layer. The multi-layer stack includes a cavity therein having a designated liquid. The radiation-absorbing material and the substrate layer form a bonding interface therebetween. The bonding interface includes a composite joint that secures the radiation-absorbing material and the substrate layer to each other. The composite joint includes a perimeter seal that extends along the cavity and a field joint that surrounds the perimeter seal. The perimeter seal is positioned between the cavity and the field joint.

In some aspects, the perimeter seal and the field joint have different makeups.

In some aspects, remnants of the designated liquid exist along or within the composite joint. The perimeter seal may be positioned between the remnants and the cavity.

In some aspects, the substrate layer is a first substrate layer, the device further comprises a second substrate layer, and the first substrate layer, the radiation-absorbing material, and the second substrate layer are continuous layers such that the device is devoid of ports that would permit flow of the designated liquid into or out of the cavity.

In some aspects, the device may also include a target layer along at least one of the first substrate layer or the second substrate layer. The target layer may include an opaque material located thereon in a designated pattern. Optionally, the designated liquid includes a material that emits light when excited by a light source.

In some aspects, the second substrate layer may include a flexible membrane and the device may also include an actuator that is operably positioned within or adjacent to the cavity. The actuator may be configured to be activated and deactivated to change pressure within the cavity and move the flexible membrane.

In some aspects, the cavity may include a designated imaging region and a gutter region that exists between the designated imaging region and the radiation-absorbing material. The designated imaging region has a target to be imaged and the gutter region is devoid of the target.

It is to be understood that any features of the device may be combined together in any desirable manner. Moreover, it is to be understood that any combination of features of the device and/or of the method may be used together, and/or that any features from either or both of these aspects may be combined with any of the examples disclosed herein.

In another example, a device is provided that includes a substrate layer and a flexible membrane including a radiation-absorbing material. The radiation-absorbing material is disposed along the substrate layer. The flexible membrane and the substrate layer define a cavity therebetween and have a designated liquid therein. The device also includes an actuator operably positioned within or adjacent to the cavity. The radiation-absorbing material forms a composite joint that secures the substrate layer and the flexible membrane to each other. The composite joint includes a perimeter seal that surrounds the cavity and a field joint that surrounds the perimeter seal. The actuator is configured to be activated and deactivated to change pressure within the cavity and move the flexible membrane.

In some aspects, the actuator, the designated liquid within the cavity, and the flexible membrane collectively operate as a liquid lens or a fluidic valve.

In some aspects, the actuator includes at least one of an electrode, a piezoelectric material, or a resistive heater, or the actuator is configured to be modulated by light.

It is to be understood that any features of this example of the device may be combined together in any desirable manner. Moreover, it is to be understood that any combination of features from this device and/or the other device and/or the other method may be used together, and/or that any features from any or all of these aspects may be combined with any of the features of the examples disclosed herein.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 14 is a cross-section of the wafer stack of FIG. 13 after a designated liquid has been provided into cavities of the wafer stack.

FIG. 15 is a cross-section of the wafer stack of FIG. 13 after a substrate layer has been added to the working stack of FIG. 13.

FIG. 16 is a cross-section of the wafer stack of FIG. 15 after the working stack has been diced to separate individual devices.

DETAILED DESCRIPTION

Figure 1:
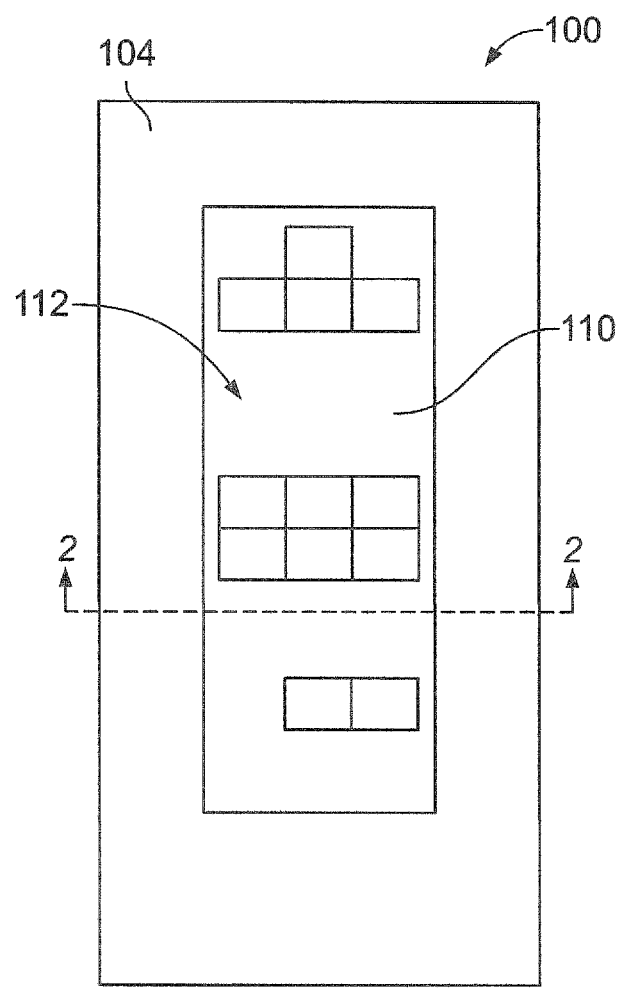
FIG. 1 is a plan view of a device in accordance with an example that is configured to at least one of contain (or hold) a liquid, or have a liquid flow pass therethrough.

Provided in some examples herein are devices that hold a liquid or are configured to have a liquid flow therethrough, and methods of making the same. Examples set forth herein include devices and methods of manufacturing the same. The devices include multi-layer structures in which adjacent layers have different absorption characteristics that enable laser-bonding or laser-welding. The devices also include cavities where one or more liquids are present. As such, the devices may be referred to as fluidic devices. However, the fluidic devices may have other components in addition to the liquid and multi-layer structures. For example, a fluidic device may include a microcontroller that is communicatively coupled to actuators, such as electrodes, that are positioned operably adjacent to or within one or more cavities.

The liquid may have a uniform composition or may be a mixture of different (liquid) compositions. In some examples, the liquid includes a polar liquid (e.g., water, aqueous solution) and a non-polar liquid (e.g., oil). The fluidic devices include a plurality of layers in which two adjacent layers form an interface therebetween. The fluidic devices are configured to impede leakage of the liquid out of the cavity through the interface. In particular examples, the fluidic devices may include a reduced number of bubbles within the cavity compared to other known devices.

In some examples, the fluidic devices include at least one of a liquid valve, a liquid mirror, or a liquid lens. The liquid valves, mirrors or lenses, may include microcavities that are enclosed by a flexible membrane and have a liquid disposed therein. The liquid may be moved by an actuator, thereby flexing a portion of the flexible membrane and changing a state of the valve, mirror or lens. Examples may reduce, or in some examples even eliminate bubbles that exist within the microcavities.

In some examples, the fluidic devices are optical alignment tools. The optical alignment tools may be used to, for example, calibrate the optical assembly of fluorescence and non-fluorescence based optical systems. In some cases, the precision of these optical systems may be at a nanometer scale, which may be particularly useful for next generating sequencing systems. Examples may also find potential use in the semiconductor, biotechnology, and consumer industries. Optical alignment tools may be used to align high precision semiconductor tools, such as mask aligners and steppers. Examples may also be used to calibrate machine vision systems or consumer devices, such as microscopes. Fluidic devices set forth herein may also be used in optical coherence tomography and fluorescence based biological imaging.

The device may include a plurality of discrete substrate layers. For example, a solid support layer may have a radiation-absorbing material disposed along a side of the solid support layer. The radiation-absorbing material may be patterned to form open-sided cavities along the substrate layer. An excessive amount of a liquid may be provided into the open-sided cavities. For example, the substrate layer and the radiation-absorbing material may be submerged within the liquid to allow the liquid to flow into the open-sided cavities. In another example, the liquid is poured directly into the cavities. Another substrate layer is stacked onto the other layers to enclose the open-sided cavities. When the substrate layer is stacked onto the other layers, the liquid may not only be present within the channel (and without bubbles), but also present along an interface between the radiation-absorbing material and the substrate layer.

To secure the radiation-absorbing material and the substrate layer together, the method includes two laser-welding stages while the liquid is present between the radiation-absorbing material and the substrate layer. The stages are not necessarily temporally separate or distinct (e.g., turn off laser after first stage and then turn on again for second stage). Instead, the stages may be performed by a single radiation session in which different patterns are used for each stage. For example, the first stage may include directing a beam spot along a single path that circumscribes the enclosed cavity. This first laser-welding stage forms a "perimeter seal." The second laser-welding stage may then weld the remaining portion of the interface, which may be a much larger area than the area of the perimeter seal. This second laser-bonding stage forms a "field joint." The perimeter seal may prevent or impede bubbles from forming within the enclosed cavity when the remainder of the interface is laser-welded to form the field joint. The field joint ensures that the different layers are sufficiently joined and do not inadvertently separate.

Figure 2:
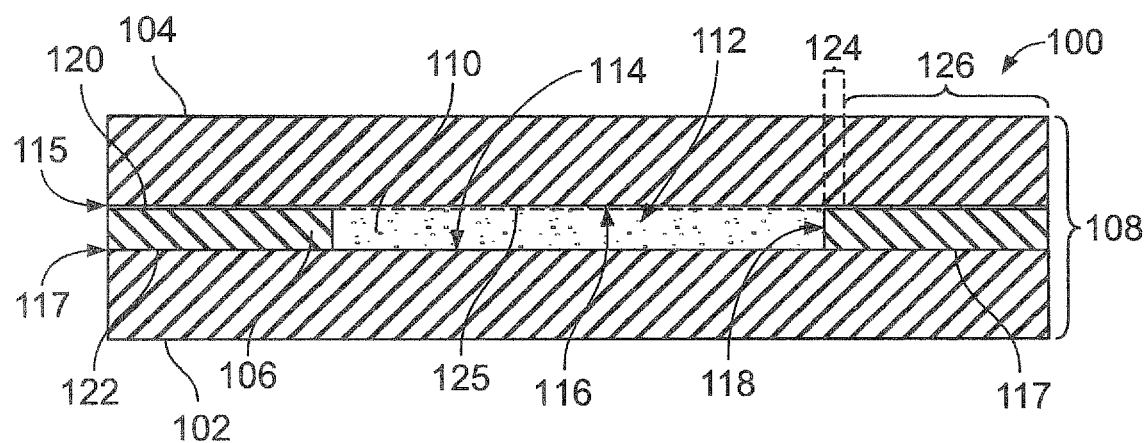
FIG. 2 is a cross-section of the device taken along the lines 2-2 in FIG. 1.

FIG. 1 is a plan view of a device 100 in accordance with an example. FIG. 2 is a cross-section of the device 100 taken along the lines 2-2 of FIG. 1. The device 100 is designed to have a designated liquid 110 therein. When the device 100 contains a liquid, the device 100 may be referred to as a fluidic device. In particular examples, the fluidic device 100 is an optical device that is used to, for instance, calibrate an imaging system or form a liquid lens. For example, the liquid 110 may include one or more light-emitting materials. The light-emitting material can include one or more fluorescent or luminescent molecules. In certain examples, the light-emitting materials are configured to be excited by light of different wavelengths and emit light signals at different wavelengths. For example, the fluorescent molecules may include at least one of a Rhodamine dye or an oxazine dye. As another example, the designated liquid 110 may be a liquid solution that includes one or more types of quantum dots that provide the desired light emissions.

The light-emitting materials may be suspended within a suitable liquid. For example, a suitable liquid may be transparent or translucent to the wavelengths that are intended to pass through the liquid. Optionally, the liquid may also have a high viscosity to reduce the likelihood of wicking into gaps. The liquid may also have a high boiling point. As one example, the liquid in which the light-emitting materials are suspended may be ethylene glycol. In other examples, however, the liquid in which the light-emitting materials are suspended may be other liquids, such as water.

In some examples, the device 100 is devoid of ports that would permit flow of the designated liquid 110 into or out of the device 100. The designated liquid 110 may be encapsulated within the device 100 such that the designated liquid 110 is not permitted to exit the device 100 without physically separating components of the device 100. In alternative examples, however, the designated liquid 110 may be permitted to flow through the device 100. For example, the device 100 may form part of a continuous flow system in which liquids having different reagents are directed through the device 100.

The device 100 includes a plurality of discrete components that are coupled to one another along respective interfaces. In the illustrated example, the discrete components of the device 100 include a first substrate layer 102 (FIG. 2), a second substrate layer 104 (FIGS. 1 and 2), and a radiation-absorbing material 106 (FIG. 2) disposed between the first and second substrate layers 102, 104. For some examples, the radiation-absorbing material 106 may be a radiation-absorbing layer. In such examples, the radiation-absorbing layer functions as a spacer that separates two other layers, such as the first and second substrate layers 102, 104.

Although FIGS. 1 and 2 show only three layers of the device 100, other examples may include only two layers or other examples may include more than three layers. It should also be understood that other elements may be added to the device 100 or modifications may be made to the device 100.

When the first substrate layer 102, the second substrate layer 104, and the radiation-absorbing material 106 are positioned side-by-side along the respective interfaces, the combined first substrate layer 102, second substrate layer 104, and radiation-absorbing material 106 may be referred to as a multi-layer stack 108. For instances in which the multi-layer stack 108 is being manipulated, processed, or otherwise worked upon, the multi-layer stack 108 may be referred to as a working stack.

The device 100 includes a cavity 112 therein having the designated liquid 110 (FIG. 2) therein. The cavity 112 may be referred to as the "cavity of the working stack" or the "working-stack cavity" to distinguish the cavity 112 from other cavities. As shown in FIG. 2, the cavity 112 is an enclosed cavity that is entirely defined by surfaces of the layers of the device 100. For example, a bottom of the cavity 112 is defined by an interior surface 114 of the first substrate layer 102. A top of the cavity 112 is defined by an interior surface 116 of the second substrate layer 104, and sides of the cavity 112 are defined by edge surfaces 118 of the radiation-absorbing material 106. In other examples, the cavity 112 may open to an exterior of the multi-layer stack 108 (or device 100). For example, the cavity 112 may be a flow channel extending between an inlet port and an outlet port that each open to the exterior of the device 100. In such examples, the cavity 112 may be referred to as a covered cavity (or covered channel) having at least one open end.

Also shown in FIG. 2, a bonding interface 115 is defined between the radiation-absorbing material 106 and the second substrate layer 104, and a bonding interface 117 is defined between the radiation-absorbing material 106 and the first substrate layer 102. A first field joint 122 may be formed along the bonding interface 117, and a composite joint 120 may be formed along the bonding interface 115. The composite joint 120 includes a perimeter seal 124 and a second field joint 126. As described herein, the first field joint 122 and the composite joint 120 may be generated by one or more laser-welding (or laser-bonding) operations.

In the illustrated example, the device 100 has an array of fiducial markers 125 along the interior surface 116. The fiducial markers 125 are configured to be imaged by an imaging system to calibrate the imaging system. The fiducial markers 125 may have a variety of shapes and can be positioned to provide a variety of patterns. The shapes and/or patterns may be designed for evaluating optical alignment of an imaging system. For example, a fiducial marker may have a single large "+" shape. Such shapes may be used for XY positioning of the imaging system. The fiducial markers may form an array of pinholes that cover the field of view. These arrays may be used to evaluate image quality and focusing metrics, such as Full-Width-Half-Maximum of the imaged spots, field curvature, image tilt, axial chromatic shift, etc. For example, the pin-holes may be circular pinholes having a diameter that is one micrometer (1 µm). As another example, the array may have a hexagonal pattern with a 3 µm pitch. There may be other patterns present such as "MTF line pairs" distributed around the field of view to evaluate Modulation Transfer Function. For examples that use chrome for the fiducial markers, the pattern may be designed to allow an autofocus laser to pass through the chrome in the center of the field of view with the perimeter of the field of view having small objects, such as 5 µm squares. Such arrays can be used to evaluate best-focus Z position.

Alternatively or in addition to the fiducial markers 125 being positioned along the interior surface 116, other fiducial markers may be positioned along the interior surface 114. In other examples, however, the fluidic device does not include fiducial markers.

Figure 3:
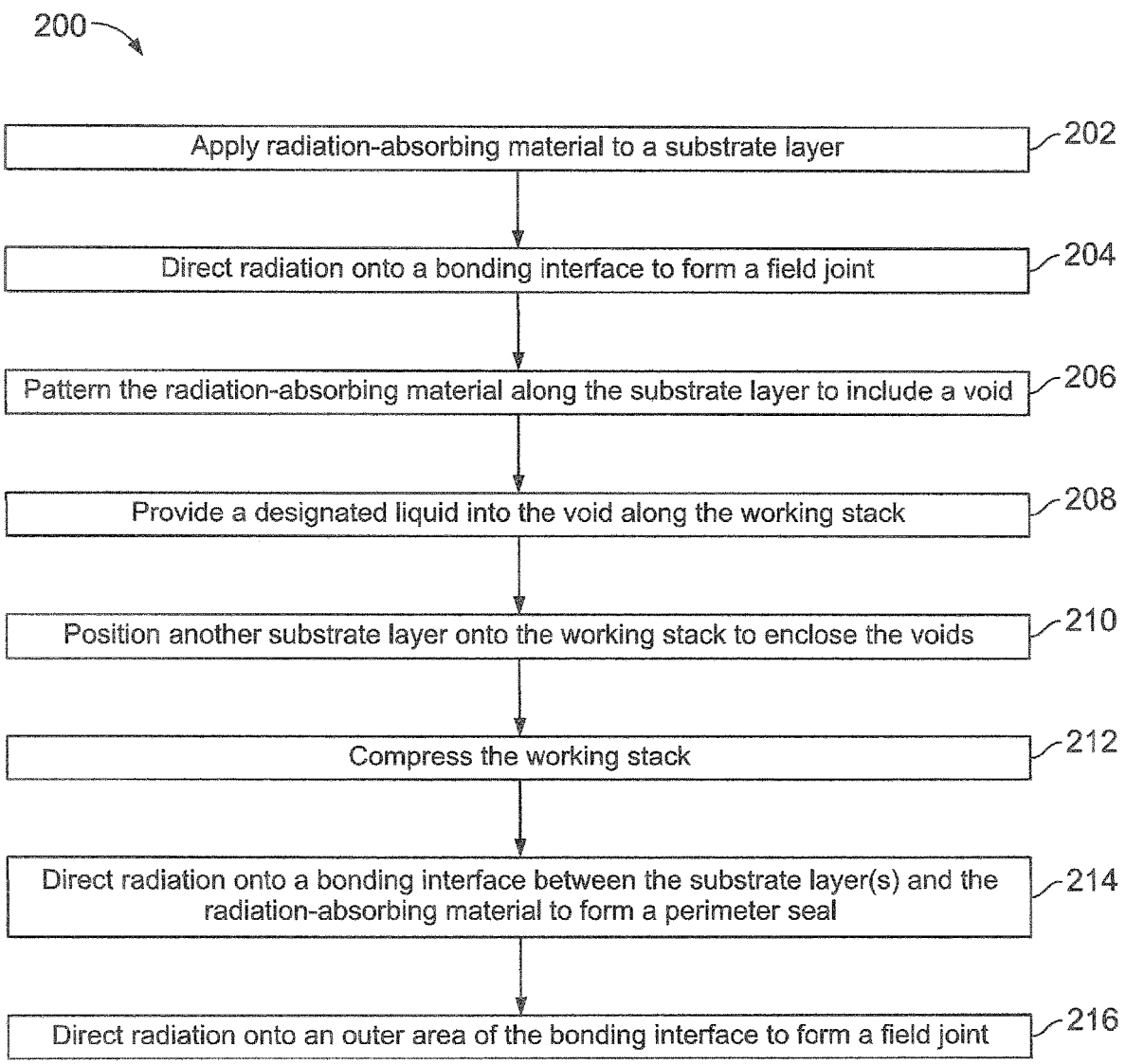
FIG. 3 is a block diagram illustrating a method of manufacturing the device of FIG. 1 in accordance with an example.

FIG. 3 is a block diagram of a method 200 in accordance with an example. The method 200 may be, for example, a method of manufacturing a working stack or multi-layer stack. The method 200 may also be a method of manufacturing a device, such as a fluidic device or, more specifically, an optical device. In the illustrated example, the method 200 is a method of manufacturing the device 100 (FIG. 1). FIGS. 4-11 illustrate operations or stages of the method 200.

Figure 4:
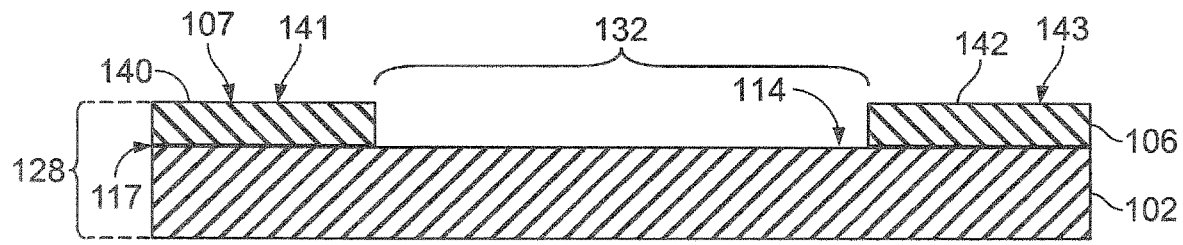
FIG. 4 is a cross-section of a working stack in accordance with an example that may be used to assemble the device of FIG. 1.

With respect to FIGS. 3 and 4, the method 200 includes applying, at 202, the radiation-absorbing material 106 to the first substrate layer 102. Specifically, the radiation-absorbing material 106 is positioned along the surface 114 of the first substrate layer 102. Optionally, the first substrate layer 102 may include a pattern of fiducial markers 125 thereon. The radiation-absorbing material 106 may be secured to the first substrate layer 102 using, for example, a laser-bonding process. During the laser-bonding operation, the radiation-absorbing material 106 and the first substrate layer 102 may be compressed. The laser may be an infrared (IR) laser. At this stage, the radiation-absorbing material 106 and the first substrate layer 102 form a working stack 128.

In one or more examples, the first substrate layer 102 is an inorganic layer, such as glass, and the radiation-absorbing material 106 is an organic layer, such as a polyimide film. The opposite sides of the radiation-absorbing layer 106 may be silanized to enhance the laser-bonding described herein. It should be understood, however, that other materials may be suitable for examples set forth herein. Moreover, it should be understood a layer may include multiple sub-layers in which one of the sub-layers includes the radiation-absorbing material.

At 204 in FIG. 3, radiation is directed to a bonding interface to form a field joint. For example, a light beam (e.g., IR laser beam) may be directed to the bonding interface 117. The light beam may be similar or identical to the light beam 160 (shown in FIG. 8). The light beam has a predetermined wavelength that is configured to be absorbed by the radiation-absorbing material 106, thereby melting the radiation-absorbing material 106. The first substrate layer 102 and the radiation-absorbing material 106 have different absorption characteristics. The first substrate layer 102 may permit a light beam having a designated wavelength (or range of wavelengths) to be transmitted therethrough and directed onto the radiation-absorbing material 106. The radiation-absorbing material 106 may essentially absorb light having the designated wavelength (or range of wavelengths). Other parameters that may be selected include power of the light beam, scan speed, uniformity of the light beam, and a force that compresses the layers together.

The light beam may be directed in a predetermined manner to cover a substantial portion of the bonding interface 117. For example, the light beam may be directed over at least 50% of the bonding interface. The light beam may perform an area weld that is directed around areas where cavities 132 will be formed. Although the directing, at 204, is indicated as occurring before the patterning, at 206, it should be understood that directing the radiation onto the bonding interface 117 may occur after the patterning.

At 206 in FIG. 3, the radiation-absorbing material 106 may be patterned to form a void. In the illustrated example, the radiation-absorbing material 106 is patterned while the radiation-absorbing material 106 is disposed along the surface 114 of the first substrate layer 102. For example, the radiation-absorbing material 106 may be selectively ablated by directing a light beam onto the radiation-absorbing material 106 and moving the light beam in a predetermined pattern. The light beam may be an ultraviolet (UV) laser beam. The ablation may completely remove the radiation-absorbing material 106 or, alternatively, produce cut-outs of the radiation-absorbing material 106 that can be removed. In other examples, however, the radiation-absorbing material 106 may be patterned prior to positioning the radiation-absorbing material 106 along the surface 114. The radiation-absorbing material 106 may constitute a pre-formed film or layer. In such instances, the patterning, at 206, occurs prior to the positioning, at 202. In addition to selective ablation, the radiation-absorbing material 106 may be patterned through other techniques. For example, the radiation-absorbing material 106 may be chemically etched or molded to have a predetermined structure.

After patterning, at 206, the radiation-absorbing material 106 and the first substrate layer 102 define an open-sided cavity 132. With respect to FIG. 4, the radiation-absorbing material 106 forms a first section 140 and a second section 142. The first and second sections 140, 142 are spaced apart from each other with the open-sided cavity 132 therebetween. The first and second sections 140, 142 include respective portions 141, 143 of a material surface 107 of the radiation-absorbing material 106. The portions 141, 143 of the material surface 107 are exposed in FIG. 4.

Figure 5:
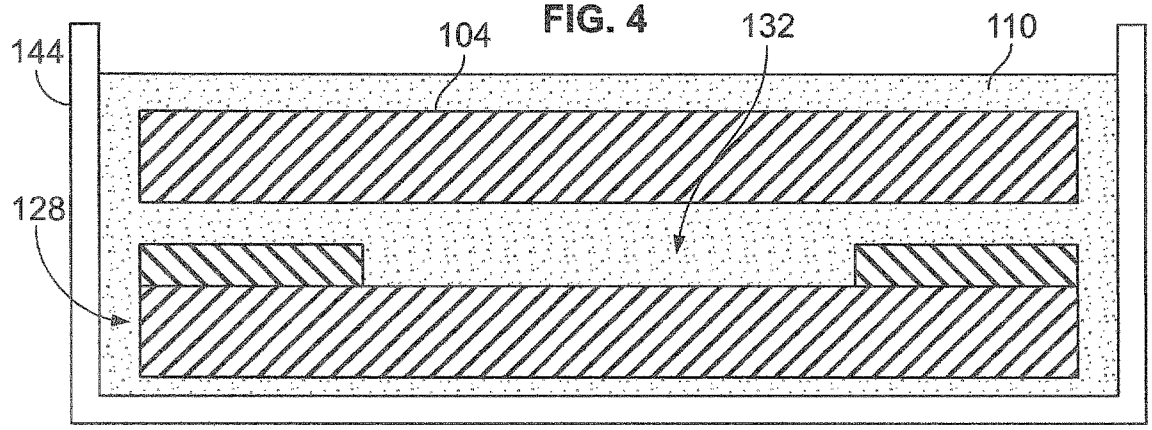
FIG. 5 is a cross-section of the working stack of FIG. 4 immersed within a designated liquid as the device of FIG. 1 is assembled in accordance with an example.

At 208 in FIG. 3, the designated liquid 110 may be provided into the void, e.g., the open-sided cavity 132 shown in FIG. 4. The volume of the designated liquid 110 may be excessive such that the designated liquid 110 overflows onto the portions 141, 143 of the material surface 107. FIG. 5 illustrates one method for providing, at 208, the designated liquid 110 into the open-sided cavity 132. In this example, the designated liquid 110 is held within a container 144. The working stack 128 may be submerged or immersed within the designated liquid 110 such that the designated liquid 110 flows into the open-sided cavity 132.

Figure 6:
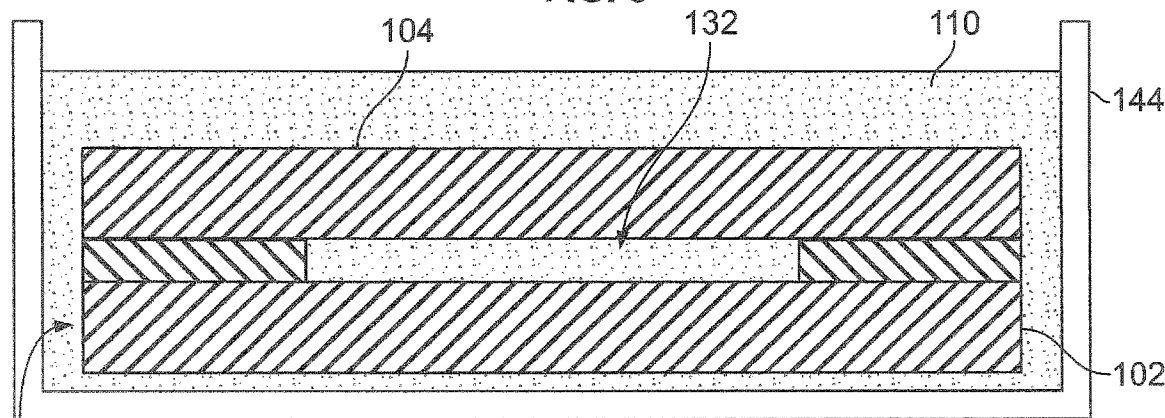
FIG. 6 is a cross-section of the working stack of FIG. 5 after a substrate layer has been positioned to enclose cavities.

With respect to FIGS. 3, 5 and 6, the second substrate layer 104 may be positioned, at 210, onto the working stack 128 to enclose the open-sided cavity 132 (FIG. 5), thereby forming the enclosed cavity 112 (FIG. 6) having the designated liquid 110 therein. Prior to the second substrate layer 104 being positioned onto the working stack 128, the open-sided cavity 132 may be essentially devoid of bubbles. To ensure this, the container 144 may be shaken or vibrated to dislodge any air bubbles attached to surfaces. The interior surface 116 of the second substrate layer 104 may also be essentially devoid of bubbles. As such, the enclosed cavity 112 may have the designated liquid 110 therein without bubbles. As shown in FIG. 6, the first substrate layer 102, the radiation-absorbing material 106, and the second substrate layer 104 form a working stack 150.

Although the above describes the second substrate layer 104 being positioned onto a working stack 128 that includes the first substrate layer 102, it should be understood that, in other examples, the first substrate layer 102 may be positioned onto a working substrate that includes the second substrate layer 104.

Figure 7:
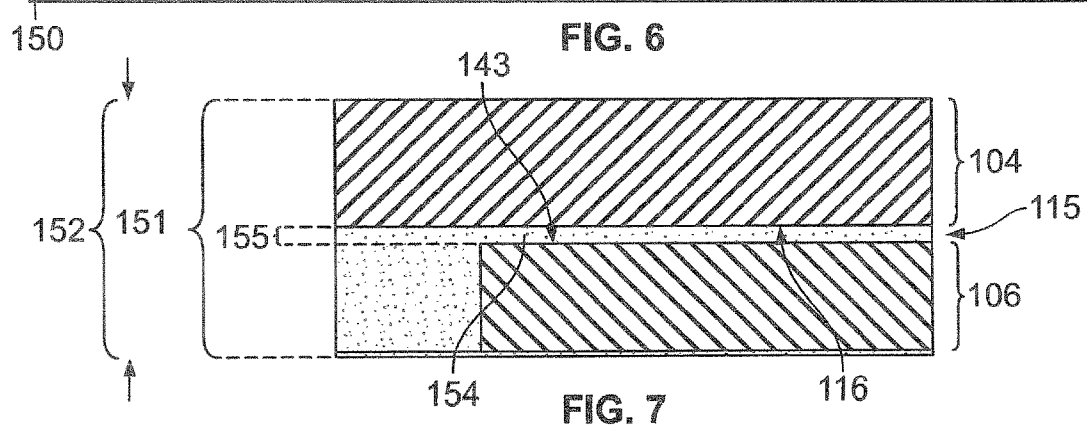
FIG. 7 is an enlarged cross-section of a portion of the working stack of FIG. 6 illustrating in greater detail a bonding interface between two layers when the two layers are compressed in accordance with an example.

FIG. 7 is an enlarged cross-section of a portion 151 of the working stack 150, illustrating in greater detail the bonding interface 115 between the radiation-absorbing material 106 and the second substrate layer 104. When the second substrate layer 104 is positioned onto the working stack 128 (FIG. 5), the designated liquid 110 exists between the respective portions 141, 143 of the material surface 107 and the interior surface 116 of the second substrate layer 104. When the working stack 150 is compressed or, more specifically, a compression force 152 is applied, at 212 in FIG. 3, to the second substrate layer 104 and the first substrate layer 102, a film 154 of the designated liquid 110 extends along the bonding interface 115. A thickness 155 of the film 154 in FIG. 7 is increased so that the film 154 is visible in the figure.

In some cases, the film 154 may be thin enough that the surfaces 107, 116 are essentially only wetted. Nonetheless, the designated liquid 110 exists between the surfaces 107, 116. The amount of the designated liquid 110 in the film 154 may be based on the adhesive and cohesive forces of the designated liquid 110 and/or the surface energy of the surfaces 107, 116. The amount of the designated liquid 110 in the film 154 may be based on the contour of the surfaces 107, 116. In some examples, the above parameters may be selected to minimize the amount of the designated liquid 110. The amount of the designated liquid 110 in the film 154 is an amount that is at least more than an amount of the designated liquid if the surfaces 107, 116 were dry or had not been immersed within the designated liquid 110. By way of example only, a thickness 155 of the film 154 may range from about 1 micrometer to about 2 micrometers.

Figure 8:
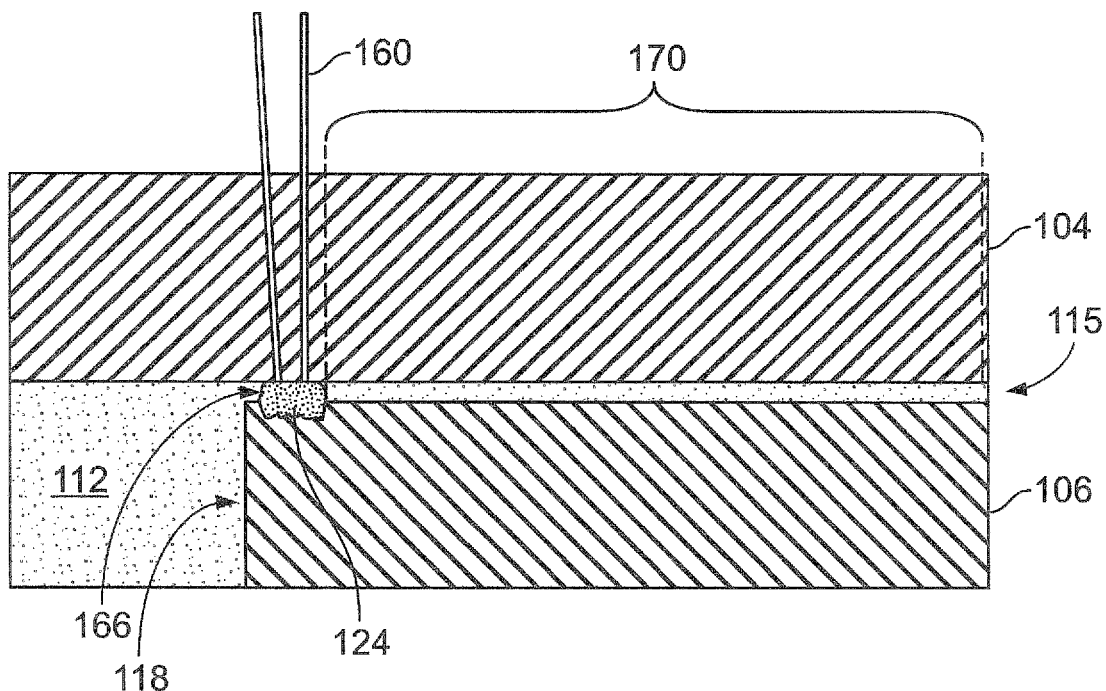
FIG. 8 illustrates radiation being applied to the bonding interface to form a perimeter seal.

FIG. 8 illustrates radiation being applied to the bonding interface 115. At 214 of the method 200 (FIG. 3), radiation is directed onto the bonding interface 115 to form the perimeter seal 124. The perimeter seal 124 extends along the cavity 112 and separates the cavity 112 from an outer area 170 of the bonding interface 115. The perimeter seal 124 may surround the cavity 112. The perimeter seal 124 may impede an ingress of bubbles or other liquid from the outer area 170 to the cavity 112 during subsequent operations.

The radiation is provided by a light beam 160 from a light source (e.g., laser) having a designated wavelength or range of wavelengths. The wavelength or wavelengths may be selected such that the light beam 160 may be transmitted through the second substrate layer 104 without substantial absorption, but absorbed by the radiation-absorbing material 106. For example, the second substrate layer 104 may be a transparent layer, and the radiation-absorbing material 106 may be an opaque material. The light beam 160 may be concentrated at a beam spot 166. The beam spot 166 may be a focal point or proximate to a focal point of the light beam 160. By way of example, the beam spot 166 may have a diameter ranging from about micrometers 20 to about 30 micrometers, although it is contemplated that the diameter may be larger or smaller in other examples.

The light beam 160 is shown orthogonal to the plane of the bonding interface 115, but in this or other examples the light beam 160 can impinge at an angle with respect to the plane. Impinging at an angle can be beneficial when creating certain bonding patterns or to avoid features present on the second substrate layer 104 or the radiation-absorbing material 106.

Although not wishing to be bound to a particular hypothesis, it is believed that the radiation melts the radiation-absorbing material 106 and/or the material of the second substrate layer 104 to provide for closer contact to facilitate covalent bonding between the different materials. Melting one or both of materials at the bonding interface 115 can be useful whether covalent bonds or non-covalent interactions result. Optionally, the respective surfaces of the radiation-absorbing material and/or the material of the second substrate layer 104 that are melted may be silanized prior to applying the light beam. The resulting perimeter seal 124 may be advantageous in preventing leakage. Moreover, the laser welding techniques described herein may form a joint between different materials without causing substantial deformation of the second substrate layer 104 or the radiation-absorbing material 106.

The radiation is directed, at 214 in FIG. 3, along a predetermined path to form the perimeter seal 124. More specifically, the beam spot 166 impinges the bonding interface 115 and is directed along the predetermined path. The beam spot 166 may continuously move along the bonding interface 115 such that the beam spot 166 forms stripes or swaths of melted material. When the beam spot 166 is located at a point along the predetermined path, the concentrated light is absorbed by the radiation-absorbing material. Thermal energy quickly increases and melts the radiation-absorbing material 106. The designated liquid 110 may be vaporized. The thermal energy in the radiation-absorbing material 106 may also cause the material of the second substrate layer 104 to melt. When the beam spot 166 moves away from this point, the thermal energy dissipates and the melted materials of the radiation-absorbing material 106 and the second substrate layer 104 solidify to form a weld.

The perimeter seal 124 is designed to impede an ingress of bubbles into the cavity 112 from an outer area 170 of the bonding interface 115 as the radiation is applied. In some examples, the perimeter seal 124 extends generally along a perimeter of the cavity 112. The perimeter of the cavity 112 is defined by the edge surfaces 118. As shown in FIG. 8, the perimeter seal 124 is positioned immediately adjacent to the cavity 112. The perimeter seal 124 may continue along a predetermined path that is similar to the shape of the perimeter of the cavity 112. In such instances, the perimeter seal 124 may be characterized as circumscribing the cavity 112.

Figure 22:
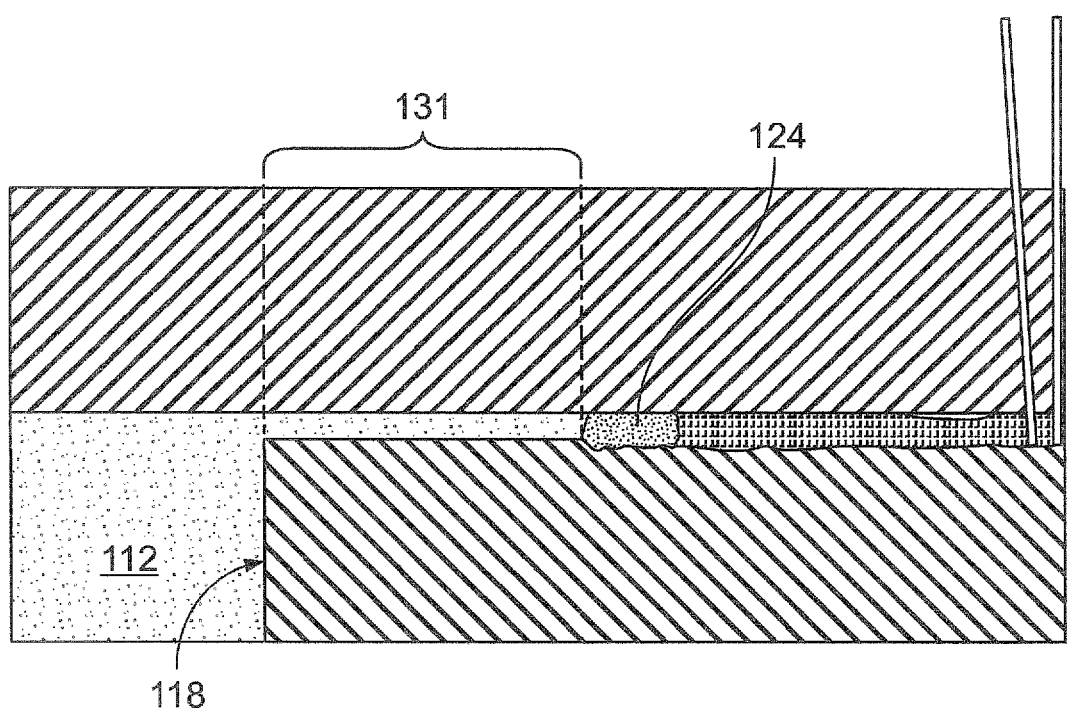
FIG. 22 illustrates a composite joint in accordance with an example in which the perimeter seal is spaced from the cavity.

However, the perimeter seal 124 is not to extend immediately adjacent to the cavity 112. For example, the perimeter seal 124 may be spaced apart from the cavity 112. This configuration is shown in FIG. 22 in which a spacing 131 exists between the perimeter seal 124 and the cavity 112 (or edge surfaces 118). Such examples may be used to reduce the likelihood that bubbles will develop within the cavity 112 due to the localized heating adjacent to the cavity 112. By way of example, the spacing 131 may be at least 0.2 millimeters (mm), at least 0.3 mm, at least 0.4 mm, or at least 0.5 mm. However, spacing larger and smaller may be used, including no spacing. The perimeter seal 124 may be non-parallel to the perimeter of the cavity 112. The perimeter seal 124 is positioned to prevent bubbles, which may develop in the outer area 170 as the radiation is applied, from moving toward and into the cavity 112.

Figure 9:
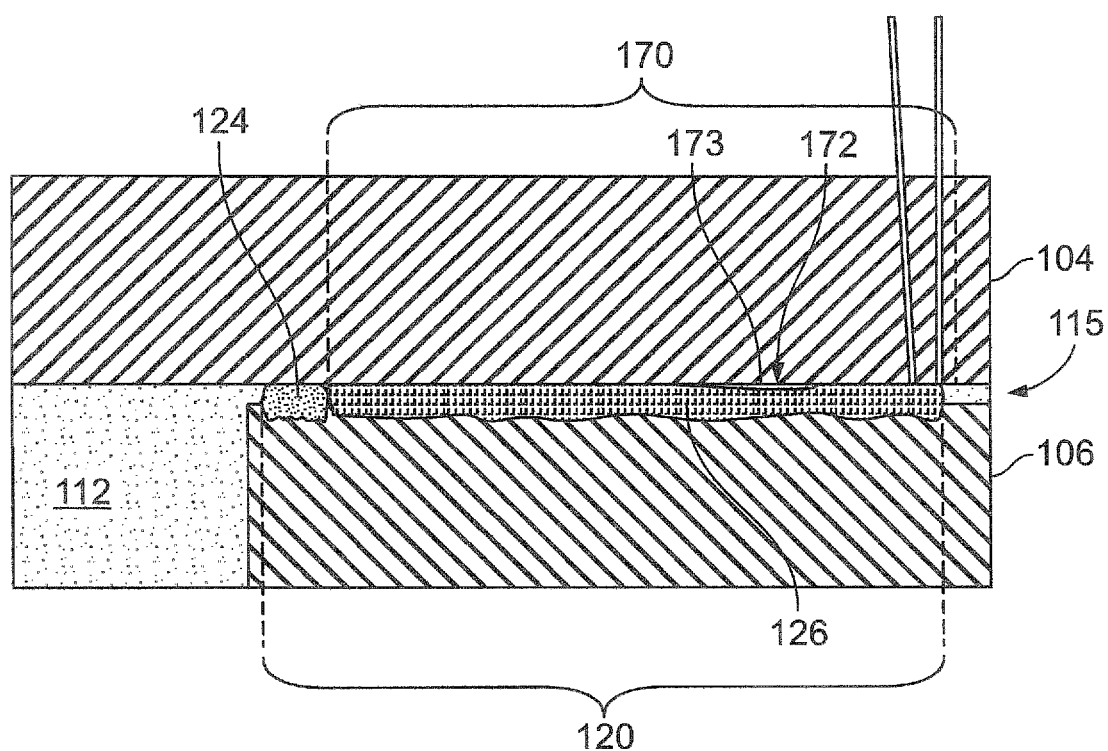
FIG. 9 illustrates radiation being applied to an outer area of the bonding interface of FIG. 7 to form a field joint that surrounds the perimeter seal of FIG. 8.

FIG. 9 illustrates radiation being applied, in accordance with 216 in FIG. 3, to the outer area 170 of the bonding interface 115 to form the second field joint 126 that surrounds the perimeter seal 124. In FIG. 9, the beam spot 166 is moving continuously left-to-right or in a direction from the perimeter seal 124 to an exterior of the device 100 (FIG. 1). In other instances, the beam spot 166 may move into or out of the page and parallel to the perimeter seal 124. As the radiation is applied, bubbles may develop that are caused by the large amounts of heat being applied to the designated liquid 110, the radiation-absorbing material 106, and the second substrate layer 104. The perimeter seal 124 impedes an ingress of the bubbles from the outer area 170 into the cavity 112 as the radiation is directed onto the outer area 170.

For both the perimeter seal 124 and the second field joint 126, it is believed that the radiation melts the radiation-absorbing material 106 and/or the material of the second substrate layer 104 to provide for closer contact to facilitate covalent bonding between the different materials. Melting one or both of materials at the bonding interface 115 can be useful whether covalent bonds or non-covalent interactions result. When the thermal energy dissipates, the mixed materials solidify to form a weld. Although the perimeter seal 124 may also function to hold the working stack 128 to the second substrate layer 104, the perimeter seal 124 alone may not be sufficient in preventing the second substrate layer 104 from inadvertently separating from the device 100. A strength of a joint may be based on, among other things, an area of the joint. To maintain the multi-layer structure, the second field joint 126 is added along the bonding interface 115.

The perimeter seal 124 and the second field joint 126 combine to form the composite joint 120. The portion of the outer area 170 that is irradiated to secure the second substrate layer 104 and the radiation-absorbing material 106 together is greater than a total area of the perimeter seal 124. For example, the portion of the outer area 170 that is irradiated may be at least five times (5×) an area of the perimeter seal 124. In some examples, the portion of the outer area 170 that is irradiated may be at least seven times (7×) the area of the perimeter seal 124. In particular examples, the portion of the outer area 170 that is irradiated may be at least ten times (10×) the area of the perimeter seal 124 or at least fifteen times (15×) the area of the perimeter seal 124. In more particular examples, the portion of the outer area 170 that is irradiated may be at least twenty times (20×) the area of the perimeter seal 124 or at least thirty times (30×) the area of the perimeter seal 124. Yet in more particular examples, the portion of the outer area 170 that is irradiated may be at least fifty times (50×) the area of the perimeter seal 124 or at least one hundred times (100×) the area of the perimeter seal 124.

In some examples, the portion of the outer area 170 that is irradiated may be within a designated range of the area of the perimeter seal 124. The lower and upper limits of such ranges may be taken from the factors described above. For example, in some examples, the portion of the outer area 170 that is irradiated may be between 5× and 15× the area of the perimeter seal 124. In some examples, the portion of the outer area 170 that is irradiated may be between 5× and 20× the area of the perimeter seal 124. In more particular examples, the portion of the outer area 170 that is irradiated may be between 5× and 30× the area of the perimeter seal 124, between 5× and 50× the area of the perimeter seal 124, or between 5× and 100× the area of the perimeter seal 124. In more particular examples, the portion of the outer area 170 that is irradiated may be between 10× and 30× the area of the perimeter seal 124, between 10× and 50× the area of the perimeter seal 124, or between 10× and 100× the area of the perimeter seal 124. In more particular examples, the portion of the outer area 170 that is irradiated may be between 20× and 30× the area of the perimeter seal 124, between 20× and 50× the area of the perimeter seal 124, or between 20× and 100× the area of the perimeter seal 124.

Figure 10:
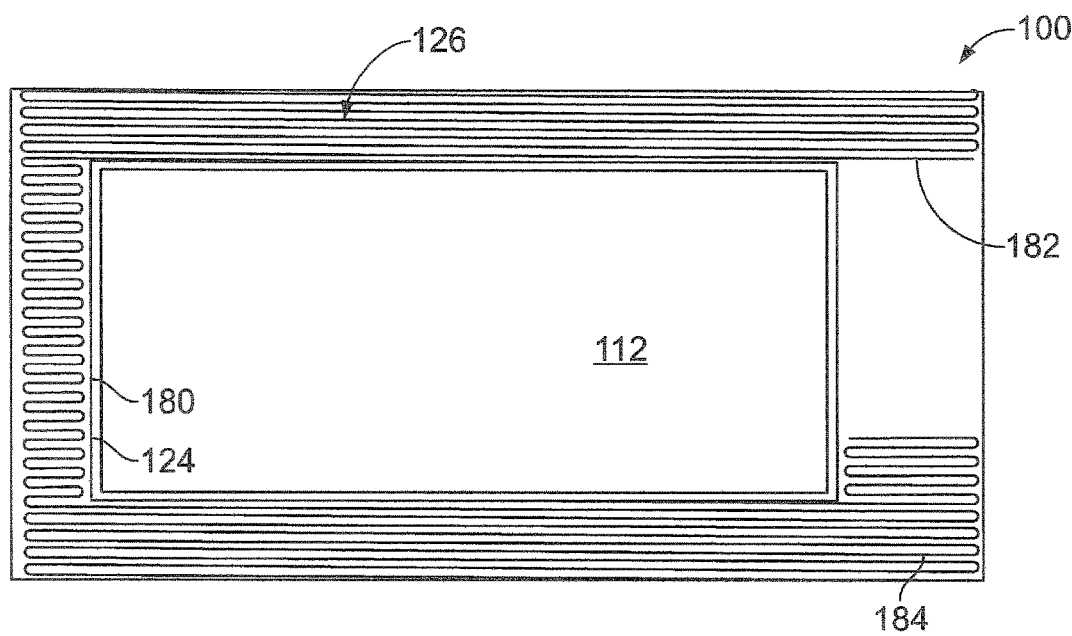
FIG. 10 is a plan view of the device of FIG. 1 showing a path that radiation may take to form the perimeter seal and the field joint of FIG. 8.

In some examples, the perimeter seal 124 and the second field joint 126 have different makeups, such that the perimeter seal 124 and the second field joint 126 may be identified through inspection of the device 100. For example, the device 100 may be diced to reveal a cross-section that extends through the perimeter seal 124 and the second field joint 126. Using a microscope (e.g., scanning electron microscope (SEM)), the cross-sectional surfaces may be examined to identify characteristics of the composite joint 120. As one example, the perimeter seal 124 and the second field joint 126 may be identified where the predetermined paths are perpendicular to one another as shown in FIG. 10. More specifically, one stripe or swath of the perimeter seal 124 may be perpendicular to a stripe or swath of the second field joint 126. The perimeter seal 124 may surround the cavity 112, whereas the second field joint 126 may include a plurality of stripes or swaths in the outer area 170.

Different makeups of the perimeter seal 124 and the second field joint 126 may include the microstructures of the perimeter seal 124 and the second field joint 126 having different characteristics. For example, gaps 172 (FIG. 9) and/or remnants 173 (FIG. 9) of the designated liquid 110 may be identified between the radiation-absorbing material 106 along the perimeter seal 124 and/or the second field joint 126. These remnants 173 and/or gaps 172 may cause different microstructures. Depending on the designated liquid 110, remnants 173 of the liquid 110 may be trapped within or along the perimeter seal 124 and/or the second field joint 126. Remnants 173 may be, for example, matter that was dissolved or mixed within the liquid 110 and/or formations in the second field joint 126 caused by heat being applied to the liquid 110. The remnants 173 may exist along or within the composite joint 120. The perimeter seal 124 may be positioned between the remnants 173 and the cavity 112.

FIG. 10 is a plan view of a profile of the device 100 showing paths 180, 182 that a beam spot may take to form the perimeter seal 124 and the second field joint 126, respectively. In some examples, as the beam spot 166 (FIG. 8) is scanned along the bonding interface 115, the beam spot 166 moves continuously from the predetermined path 180 that forms the perimeter seal 124 to the predetermined path 182 that forms the second field joint 126. This two-stage process may occur during a single radiation session. Alternatively, two separate radiation sessions may be used. A first radiation session may provide the perimeter seal 124, and a second radiation session may provide the second field joint 126.

As shown, the perimeter seal 124 circumscribes the cavity 112. For the second field joint 126, the beam spot 166 may be directed in a raster-like manner. For example, the predetermined path 182 may form a series of adjacent or abutting stripes 184. For illustrative purposes, the entire predetermined path 182 is not shown. A portion of the bonding interface 115 remains to be irradiated in FIG. 10.

Figure 11:
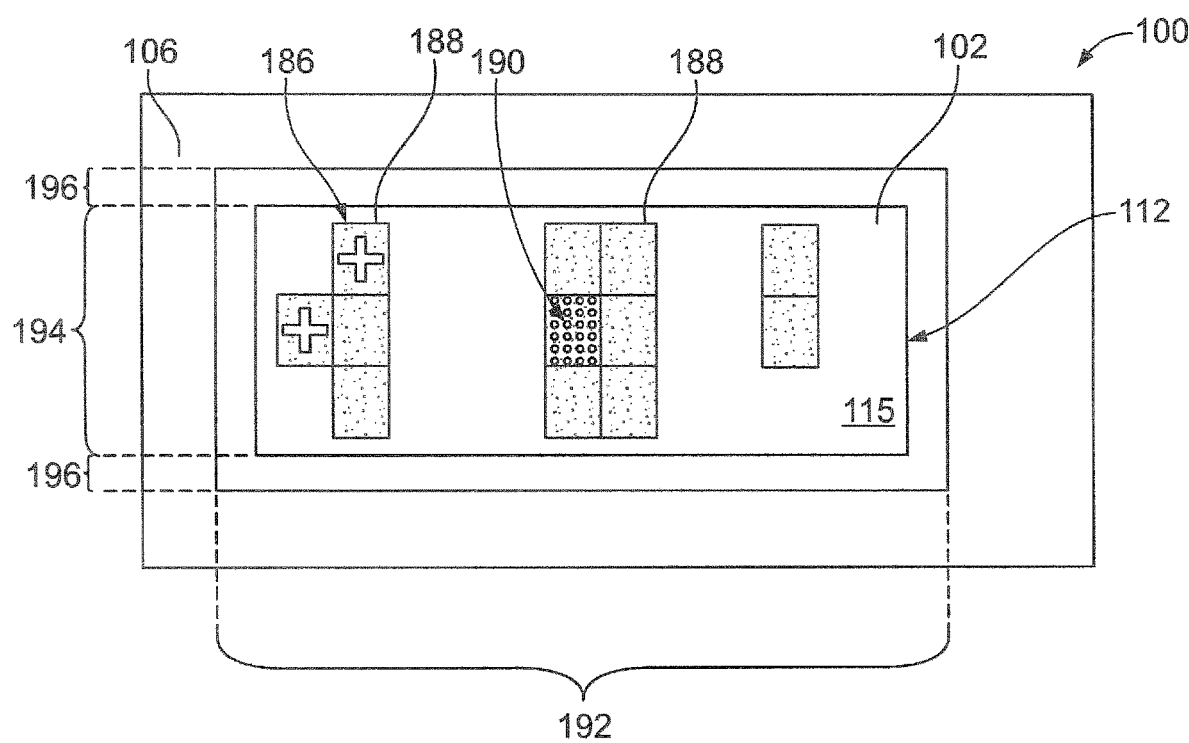
FIG. 11 is a plan view of the device of FIG. 1 illustrating a gutter region and an imaging region.

FIG. 11 is a plan view of the device 100 when the device 100 is ready for operation. In particular examples, the device 100 is devoid of one or more ports that would permit the flow of liquid into or out of the cavity 112. For example, each of the layers that define the cavity 112 is a continuous layer of material that surrounds the cavity 112. In the final construction, the layers may not have any discontinuities where a passage or channel existed prior to completion of the device 100. More specifically, the device 100 is devoid of evidence that one or more ports once existed for providing the designated liquid into the cavity 112.

In other examples, however, one or more ports to the cavity 112 may be used to add the designated liquid 110 into the cavity 112. These ports may then be plugged prior to use of the devices 100. Yet in other examples, the fluidic devices have ports that remain open throughout operation of the fluidic device. For example, examples may include flow cells.

In the illustrated example, the device 100 forms a window 192 that allows the cavity 112 to be observed (e.g., imaged). The window 192 is framed by the radiation-absorbing material 106. The window 192 includes an imaging region 194 and a gutter region 196 that is located between the imaging region 194 and the radiation-absorbing material 106. The gutter region 196 surrounds the imaging region 194. In the illustrated example, the imaging region 194 includes the fiducial markers 125. The gutter region 196 is designed to be clear of fiducial markers 125. In some examples, the gutter region 196 is provided to decrease the likelihood of bubbles entering the imaging region 194. In other examples, however, the window 192 does not include a gutter region 196.

The device 100 includes a target layer 186 having a plurality of the fiducial markers 125 disposed within the cavity 112. The target layer 186 may be attached to the first substrate layer 102 and/or the second substrate layer 104 (FIG. 2). The target layer 186 may include opaque material 188 that is printed or patterned along a surface of the corresponding substrate layer. The opaque material 188 may have a designated pattern that forms a plurality of translucent or transparent features (e.g., holes) 190 in an ordered array. The designated pattern of the opaque features and the translucent or transparent features may form the fiducial markers 125. The holes 190 in FIG. 11 have larger diameters so that they are visible in the figure. The diameters may be, for example, at least one micrometer.

Figure 12:
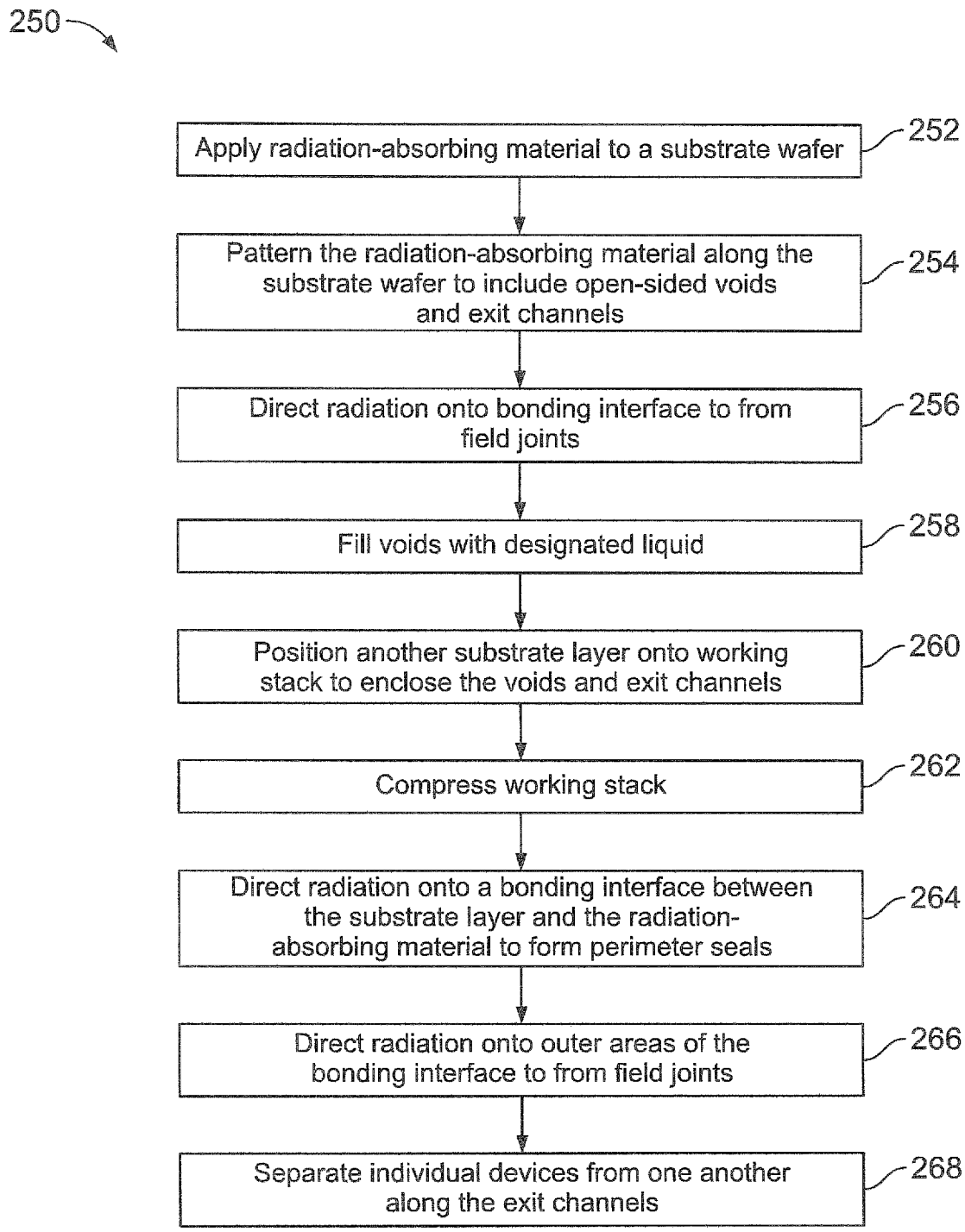
FIG. 12 is a block diagram illustrating a method of manufacturing a device in accordance with an example.

FIG. 12 is a block diagram illustrating a method 250 of manufacturing a plurality of devices 298 (FIG. 16). The devices 298 may be similar or identical to the devices 100 (FIG. 1). The method 250 is described with respect to FIGS. 13-16 and may include steps that are similar or identical to the steps of the method 200. For example, with respect to FIGS. 12 and 13, the method 250 includes, at 252, applying a radiation-absorbing material 272 to a substrate wafer 270, thereby forming a working stack 275. The substrate wafer 270 may be similar or identical to the first substrate layer 102 (FIG. 1).

At 254 of the method 250, the radiation-absorbing material 272 is patterned along the substrate wafer 270 to include open-sided cavities 274 and open-sided exit channels 276. The radiation-absorbing material 272 may be patterned through laser ablation or chemical etching, among other processes. The open-sided cavities 274 may be similar to or identical to the cavities 132 (FIG. 4). The open-sided cavities 274 are designed to become the enclosed cavities of the respective devices. In the illustrated example, each of the open-sided cavities 274 is entirely defined by a radiation-absorbing frame 278 and the substrate wafer 270 such that surfaces of the radiation-absorbing frame 278 and the substrate wafer 270 are the only surfaces that define the open-sided cavities 274. In other examples, however, the open-sided cavities 274 may be defined by other elements or layers. For example, the radiation-absorbing frame 278 and additional layers that are stacked with respect to the radiation-absorbing frame 278 may define lateral boundaries of the open-sided cavities.

The exit channels 276, however, are designed to extend between and separate adjacent radiation-absorbing frames 278. Unlike the open-sided cavities 274, the exit channels 276 are designed to be in flow communication with an exterior of the working stack 275 and/or an exterior of the radiation-absorbing material 272. At 256 in FIG. 12, radiation is directed onto a bonding interface 273 (FIG. 14) between the radiation-absorbing material 272 and the substrate wafer 270 to form field joints.

Prior to patterning the radiation-absorbing material 272 and/or generating field joints along the bonding interface 273, fiducial markers 280 (FIG. 13) may be provided along a surface of the substrate wafer 270. The fiducial markers 280 can be metal pads having shaped openings. Alternatively, the fiducial markers 280 may be provided after the radiation-absorbing material 272 is patterned or as the radiation-absorbing material 272 is patterned.

With respect to FIGS. 12 and 14, the cavities 274 may be filled, at 258, with a designated liquid 282. For example, the liquid 282 may be poured onto the working stack 275 such that the cavities 274 are filled with the liquid 282. As shown in FIG. 14, the liquid 282 is an excessive amount relative to the combined volumes of the cavities 274 and the exit channels 276. As such, the liquid 282 overflows onto material surfaces 284 of the radiation-absorbing frames 278. In FIG. 14, the liquid 282 appears like a thin film on the surface 284. Depending upon the composition of the liquid 282 and the radiation-absorbing material 272, the liquid 282 may be a thin film or a number of droplets. For excess liquid, the substrate wafer 270 may be positioned onto a semi-rigid foam or sponge 288 that absorbs liquid that flows out of the working stack 275.

FIG. 15 shows a working stack 285 that includes the working stack 275 and a substrate layer 290 positioned thereon. At 260 of the method 250 (FIG. 12), a substrate layer 290 is positioned onto the working stack 275 to enclose the cavities 274 and cover the exit channels 276. The substrate layer 290 may be positioned in a manner that reduces the likelihood of trapping air under the substrate layer 290. For example, the substrate layer 290 may be positioned at an angle such that one edge of the substrate layer 290 initially contacts the radiation-absorbing frames 278. The remainder of the substrate layer 290 may then be lowered by reducing the angle between the substrate layer 290 and the radiation-absorbing frames 278 so that displaced air is permitted to escape. At 262 (FIG. 12), the substrate wafer 270, the radiation-absorbing frames 278, and the substrate layer 290 are squeezed by a compression force 294. For example, a flexible transparent membrane (not shown) that is filled with air may press down onto the substrate layer 290 to provide an essentially evenly distributed force against the radiation-absorbing frame 278. The semi-rigid foam or sponge 288 may have a fixed position that resists movement of the working stack 285.

The substrate layer 290 squeezes and displaces the liquid 282 as the substrate layer 290 is positioned onto the working stack 275. When the liquid 282 along the material surfaces 284 is displaced, the liquid 282 may either flow into the cavities 274 or into the exit channels 276. The cavities 274 define a fixed volume. If the cavities 274 are filled, the liquid 282 along the material surfaces 284 is not permitted to flow into the cavities 274. In this case, the liquid 282 may flow into the open-ended exit channels 276. The exit channels 276 are in flow communication with an exterior. As the liquid 282 along the material surfaces 284 flows into the exit channels 276, the liquid 282 within the exit channels 276 flows into the exterior. In some examples, the exit channels 276 may reduce a thickness of the designated liquid 282 that remains along a bonding interface 292 between the substrate layer 290 and the radiation-absorbing frames 278 after the substrate layer 290 has been positioned thereon.

At 264 (FIG. 12), radiation may be directed onto the bonding interface 292 between the substrate layer 290 and the radiation-absorbing frames 278 to form perimeter seals 296. The perimeter seals 296 may be similar or identical to the perimeter seals 124 (FIG. 2). At 266 (FIG. 12), radiation may be directed onto outer areas of the bonding interface 292 to form field joints 297.

Figure 13:
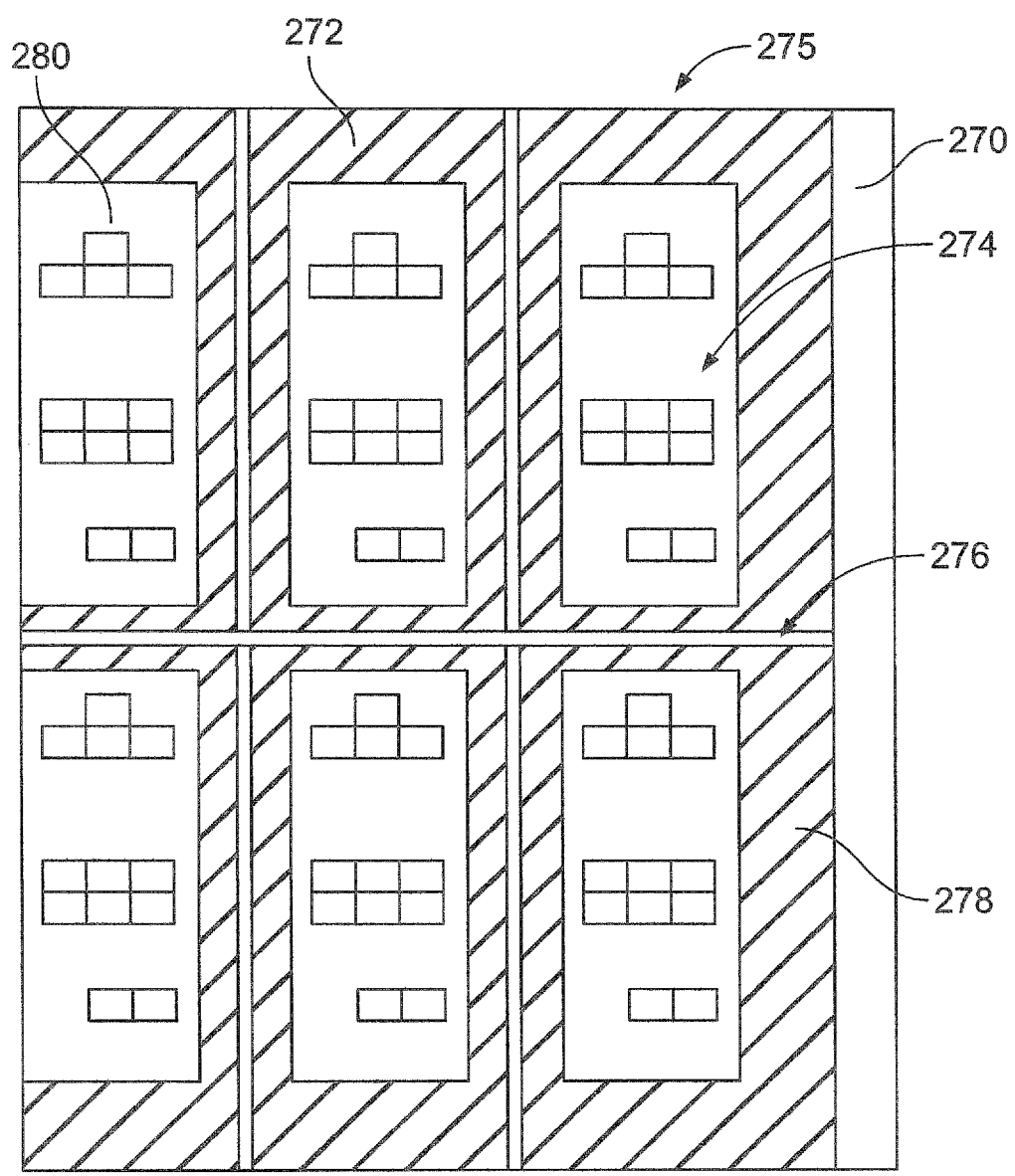
FIG. 13 is a plan view of a portion of a wafer stack during the manufacture of a plurality of devices in accordance with an example.

At 268 (FIG. 12), individual devices 298 (or multi-layer stacks) may be separated from one another. For example, as shown in FIG. 16, the working stack 285 may be diced by a tool 295 (e.g., blade) or by a laser (not shown). In particular examples, the tool 295 may be directed through the exit channels 276 (FIG. 13). The width of the tool may be greater than the width of the exit channels 276. In such instances, a clean side or edge of the devices 298 may be provided without any evidence of the exit channels 276. Accordingly, a plurality of devices 298 may be formed.

Figure 17:
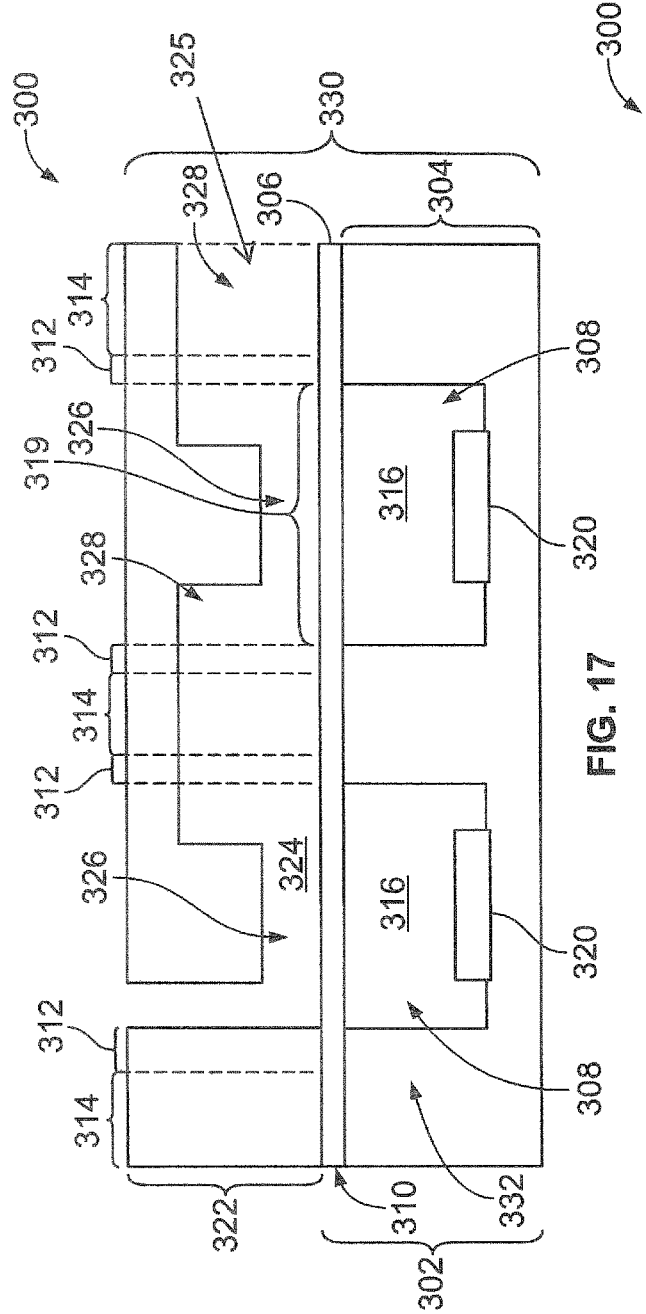
FIG. 17 is a cross-section of a device having liquid valves formed in accordance with an example as the device is being assembled.
Figure 18:
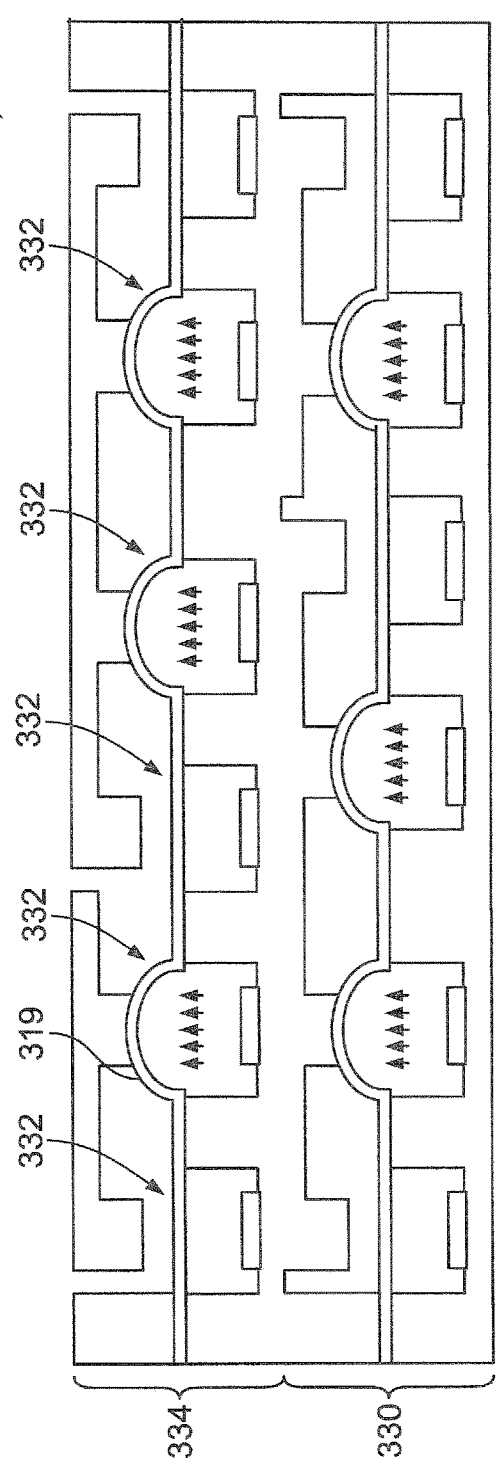
FIG. 18 is a cross-section of the device of FIG. 17 illustrating a multiplexed arrangement of the liquid valves.

FIGS. 17 and 18 illustrate cross-sections of a device 300 as the device 300 is being assembled. The device 300 may be assembled in a similar manner as the device 100 (FIG. 2) and the device 298 (FIG. 16). With respect to FIG. 17, the device 300 includes a working stack 302 having a substrate layer (or first substrate layer) 304 and a flexible membrane (or second substrate layer) 306. The flexible membrane 306 may include a radiation-absorbing material, such as a flexible polyimide membrane. In some examples, the flexible membrane 306 may have a composition that includes a radiation-absorbing material. Alternatively, the flexible membrane 306 may include multiple sub-layers. The sub-layers may include a first sub-layer having a flexible material and a second sub-layer having a radiation-absorbing material. The first and second sub-layers may have equal sizes such that the first and second sub-layers are two sheets positioned side-by-side or the second sub-layer may be selectively positioned along the first sub-layer. For instance, the second sub-layer may be patterned through ablation or etching.

The substrate layer 304 and the flexible membrane 306 are secured to each other through a composite joint 310 that includes perimeters seals 312 and field joints 314. The working stack 302 also includes a plurality of cavities 308 having a liquid 316 disposed therein. The field joints 314 surround the perimeter seals 312. The perimeter seals 312 are positioned to separate the field joints 314 from respective cavities 308. In the illustrated example, the cavities 308 are defined between the substrate layer 304 and the flexible membrane 306. The liquid 316 may be provided to the cavities 308 in a manner similar to the methods described above. For example, the flexible membrane 306 may be positioned over the cavities 308 after the liquid 316 is provided into the cavities 308. Each of the cavities 308 is surrounded by a corresponding perimeter seal 312. The perimeter seals 312 are surrounded by at least one field joint 314.

The working stack 302 also includes a plurality of actuators 320. The actuators 320 are configured to increase a pressure within the cavity 308 thereby moving a portion of the flexible membrane 306. The actuators 320 may be, for example, an electrode, piezoelectric materials, or a resistive heater. Each of the actuators 320 is positioned operably within or adjacent to at least one of the cavities 308. For example, each of the actuators 320 may be positioned such that a surface of the actuator 320 is exposed to the liquid 316 within a corresponding cavity 308. As another example, the actuators 320 may be positioned within the substrate layer 304 such that a material of the substrate layer 304 covers the surface of the actuator 320, but the actuator 320 is sufficiently near the cavities 308 such that the actuator may increase a pressure within the cavity 308.

Figure 19:
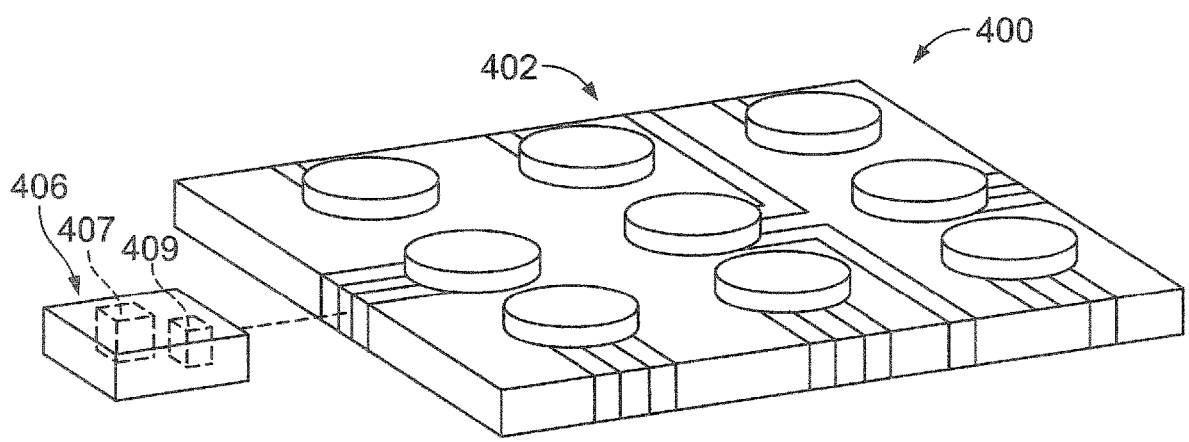
FIG. 19 is a perspective view of a device having an array of liquid lenses and/or liquid mirrors in accordance with an example.

Also shown in FIG. 17, the device 300 has a cover layer 322 positioned onto the flexible membrane 306. When the cover layer 322 is combined with the working stack 302, a first device level 330 is formed. The cover layer 322 includes an open-sided cavity 324. When the cover layer 322 is positioned onto the flexible membrane 306, the open-sided cavity 324 and the flexible membrane 306 define a fluidic channel 325 having a plurality of valve passages 326 and chambers 328. Each of the valve passages 326 are sized and shaped such that a corresponding local section 319 of the flexible membrane 306 may close the valve passage 326. For example, when the actuator 320 that is positioned operably adjacent to or within the cavity 308 is activated, the liquid 316 may cause the corresponding section 319 of the flexible membrane 306 to bulge and close (or block) the valve passage 326. The outer section or sections surrounding the corresponding sections 319 have a fixed position relative to the substrate layer 304. In the illustrated example, a plurality of electrostatic valves 332 are formed by the cavities 308, the liquid 316, the actuators 320 (e.g., electrodes), and the flexible membrane 306. Activation of the valves 332 is shown in FIG. 18. The actuators 320 may be selectively controlled by a computing sub-system, such as the computing sub-system 406 (FIG. 19). Accordingly, multi-level, multi-layered microfluidics and fluidic circuits may be formed.

FIG. 18 illustrates the fully assembled device 300. The device 300 includes the first device level 330 and a second device level 334. Optionally, the first and second device levels 330 and 334 may be in flow communication through one or more level passages (not shown). Each of the first and second device levels 330, 334 may be manufactured individually and then combined to form the device 300. Alternatively, the device 300 may be manufactured level by level in which each layer is added and secured to a working stack below it. Although FIG. 18 only shows two device levels 330, 334, a greater number of device levels (3, 4, 5, . . . n, where n is an integer) can be manufactured to enable the manufacture of a three-dimensional architecture.

As such, devices including encapsulated fluidic valves with a fluidic channel along a flexible membrane may be manufactured. Each of the valves may be activated to increase pressure in the sealed cavity for the corresponding valve, resulting in a deflection of the flexible membrane. The deflection may have a height of, for example, 50 nanometers (nm) or more. The height may be greater in other examples. For example, the deflection may have a height ranging from about 1 micrometer (um) to about 100 um or more. When the flexible membrane is deflected, flow of the liquid through the channel may be blocked. Depending on the materials used, activation may be performed electrically, piezoelectrically, thermally, optically, and/or electrochemically.

FIG. 19 is a perspective view of a device 400 having an array 402 of liquid lenses and/or liquid mirrors in accordance with an example. The device 400 may include computing sub-system 406. The computing sub-system 406 may include, for example, memory 407 for storing programmed instructions and a processor or controller 409 for executing the programmed instructions. The programmed instructions may selectively control activation of actuators disposed within the device 400. Each of the actuators may be individually addressable by the computing sub-system 405 and/or one or more sets of actuators may be addressable.

Figure 20:
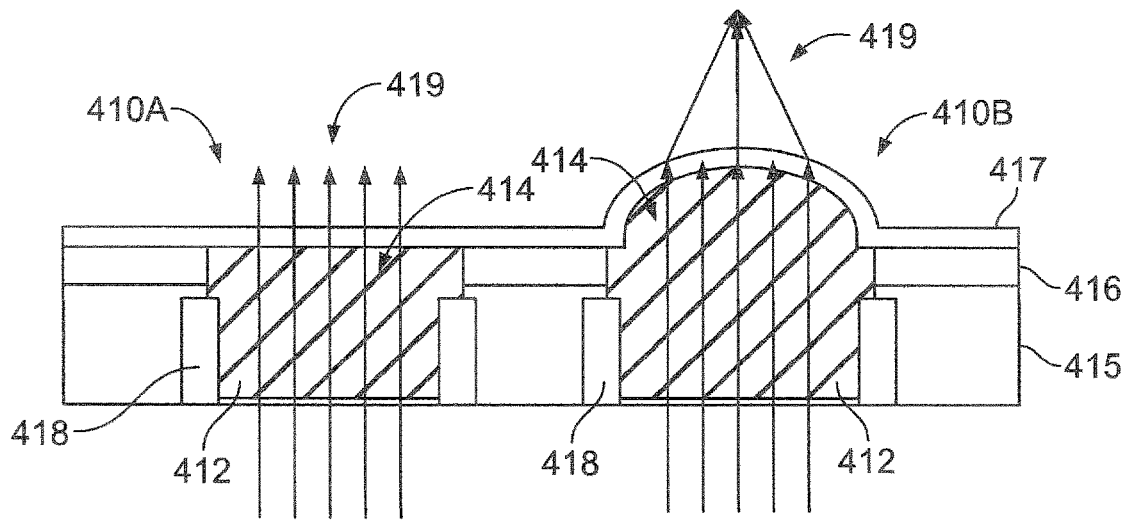
FIG. 20 is a cross-section of liquid lenses formed in accordance with an example that may be used by the device of FIG. 19.
Figure 21:
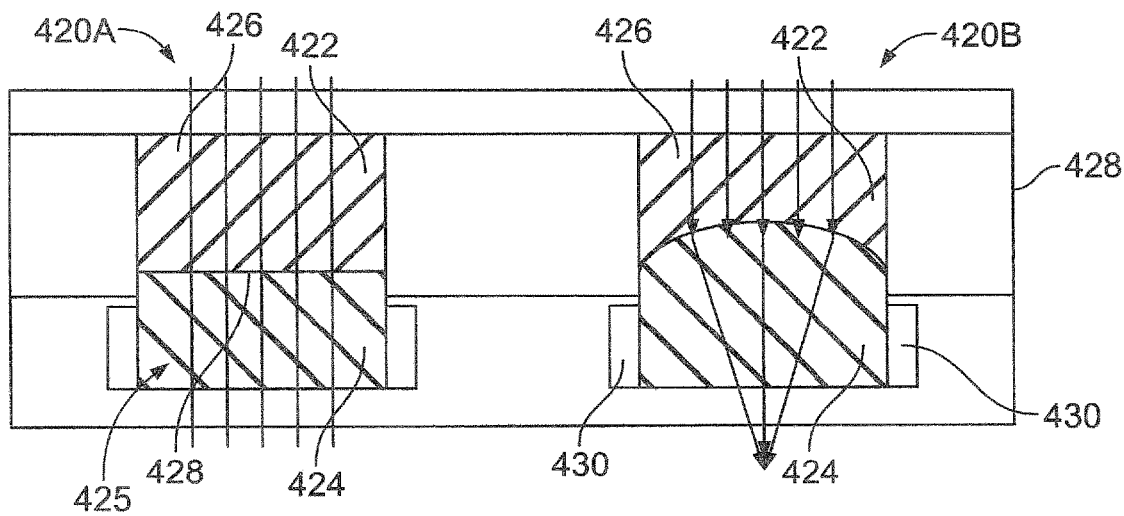
FIG. 21 is a cross-section of other liquid lenses formed in accordance with an example that may be used by the device of FIG. 19.

FIGS. 20 and 21 illustrate cross-sections of liquid lenses and/or liquid mirrors that may be used with the device 400 and that could be formed using the fluid encapsulation techniques described here. For example, FIG. 20 is a cross-section of liquid lenses 410A, 410B. The liquid lenses 410A, 410B are defined by a liquid 412 disposed within a cavity 414 that is defined by a substrate layer 415, a radiation-absorbing layer 416, and a flexible membrane 417. The liquid 412 is a high refractive index liquid (e.g., high refractive index oil). Electrodes 418 may activate the liquid electromagnetically or thermally or optically, thereby increasing pressure (e.g., electroosmotic pressure) within the cavity 414. The liquid lens 410A is in an OFF state, and the liquid lens 410B is in an ON state. When the electrodes 418 are activated and the liquid lens 410B is in the ON state, the curvature of the flexible membrane 417 changes. As such, the curvature of the lens changes, resulting in a change in the optical path length and also causing the light rays 419 to be refracted in a different manner (compared to the light rays 419 of the liquid lens 410A).

Liquid mirror configurations may be similar to the liquid lenses 410A, 410B shown in FIG. 20. In such examples, the light rays 419 may approach the liquid mirror 410A, 410B from above. The membrane 417 may be coated with a metal layer that is configured to reflect the incident light rays 419. More specifically, when the liquid mirrors 410A, 410B are activated, the curvature of the metal layer (supported by the flexible membrane 417) may scatter the incident light rays 419. When the liquid mirrors 410A, 410B are inactivated, the metal layer (supported by the flexible membrane 417) may be essentially planar and reflect the incident light rays 419. Accordingly, examples may be similar to micromirror displays having pixelated light and dark arrays.

FIG. 21 is a cross-section of liquid lenses 420A, 420B. A liquid mixture 422 is disposed within respective cavities 425 and includes a non-polar liquid 424 (e.g., oil) and a polar liquid 426 (e.g., water). When electrodes 430 are activated, the shape of a liquid interface 428 between the liquids 424, 426 changes. For the liquid lens 420A, the liquid interface 428 is planar. For the liquid lens 420B, however, the liquid interface 428 has a curved contour. The curved liquid interface 428 causes a lensing effect that directs the light rays to a focal point.

Although methods have been exemplified for examples wherein the organic solid layer absorbs radiation that causes bonding at an interface between the organic solid layer and an inorganic solid layer, it will be understood that alternatively or additionally an inorganic solid layer can be made from a material that absorbs the laser radiation. For example, an inorganic solid layer can be impregnated with a radiation-absorbing material, or it can be coated with a radiation-absorbing material. Furthermore, a radiation-absorbing material can be a liquid or other material that is present between an inorganic solid layer and an organic solid layer during or after bonding of a multilayer support. Such materials can be chosen based on ability to absorb radiation in any of a variety of regions of the spectrum including for example in the UV (e.g., extreme UV or near UV), VIS (e.g., red, orange, yellow, green, blue, indigo or violet), or IR (e.g., near IR, mid IR or far IR) regions of the spectrum. The material can be chosen, in part, based on absence of absorption in one or more of regions of the spectrum, including for example, one or more of the aforementioned regions. In some examples, the inorganic solid layer will transmit radiation in at least part of the spectrum that is absorbed by the radiation-absorbing material.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be understood that the above description is intended to be illustrative, and not restrictive. For example, the above-described examples (and/or aspects thereof) may be used in combination with each other. In addition, many modifications may be made to examples without departing from the of the scope inventive subject matter in order to adapt a particular situation or material. While the specific components and processes described herein are intended to define the parameters of the various examples, they are by no means limiting and are exemplary examples. Many other examples will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

The terms "comprise," "include," "contain," etc., and variations thereof, that are used in the specification and claims herein are intended to be open-ended, including not only the recited elements, but further encompassing any additional elements. Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 1 micrometer (µm) to about 2 µm should be interpreted to include not only the explicitly recited limits of from between from about 1 µm to about 2 µm, but also to include individual values, such as about 1.2 µm, about 1.5 µm, about 1.8 µm, etc., and sub-ranges, such as from about 1.1 µm to about 1.9 µm, from about 1.25 µm to about 1.75 µm, etc. Furthermore, when "about" and/or "substantially" are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting. Although the inventive subject matter has been described with reference to the examples provided above, it should be understood that various modifications can be made to the examples without departing from the scope of the inventive subject matter. Accordingly, the scope of the inventive subject matter is limited only by the claims.

What is claimed is:

1. A method, comprising:
    providing a working stack having a first substrate layer, a second substrate layer, and a radiation-absorbing material disposed between the first and second substrate layers, the working stack including a cavity therein having a designated liquid, wherein a bonding interface is defined between the radiation-absorbing material and at least one of the first substrate layer or the second substrate layer, the bonding interface having a film of the designated liquid;
    directing radiation onto the bonding interface along a predetermined path to form a perimeter seal, the perimeter seal positioned to separate the cavity from an outer area of the bonding interface; and
    directing the radiation onto the outer area of the bonding interface to secure the first and second substrate layers together, the perimeter seal impeding an ingress of bubbles from the outer area into the cavity as the radiation is directed onto the outer area.

2. The method of claim 1, wherein providing the working stack includes:
    positioning the radiation-absorbing material onto the first substrate layer, the radiation-absorbing material being patterned to include an open-sided cavity;
    directing radiation onto a secondary interface between the first substrate layer and the radiation-absorbing material to secure the first substrate layer and the radiation-absorbing material to each other;
    filling the open-sided cavity of the radiation-absorbing material with the designated liquid; and
    stacking the second substrate layer with respect to the radiation-absorbing material and the first substrate layer, thereby covering the open-sided cavity and forming the cavity of the working stack, the film of the designated liquid being present along the bonding interface as the second substrate layer covers the open-sided cavity.

3. The method of claim 1, wherein directing radiation onto the bonding interface to form the perimeter seal includes positioning the perimeter seal a distance away from the cavity of the working stack such that a spacing exists between the perimeter seal and the cavity.

4. The method of claim 1, wherein the working stack and the second substrate layer form at least a part of a device and wherein the first substrate layer, the radiation-absorbing material, and second substrate layer are continuous layers such that the device is devoid of ports that would permit flow of the designated liquid into or out of the cavity of the working stack.

5. The method of claim 1, wherein providing the working stack includes forming a target layer along at least one of the first substrate layer or the second substrate layer, the target layer including an opaque material located thereon in a designated pattern.

6. The method of claim 1, wherein the radiation-absorbing material includes separate sections disposed between the first and second substrate layers and an exit channel between adjacent sections of the radiation-absorbing material, the exit channel being in flow communication with at least one of an exterior of the working stack or a reservoir, wherein the designated liquid and the bubbles are permitted to enter the exit channel from the outer area of the bonding interface as the radiation is directed onto the outer area.

7. The method of claim 1, wherein the working stack includes a plurality of the cavities, and the method further comprises dicing the working stack after securing the first and second substrate layers to form a plurality of devices.

8. The method of claim 1, wherein the cavity of the working stack includes an imaging region and a gutter region that exists between the imaging region and the radiation-absorbing material, the imaging region having a target to be imaged, the gutter region being devoid of the target.

9. The method of claim 1, wherein the radiation-absorbing material includes a transparent layer and an opaque layer, the opaque layer absorbing the radiation to form a composite joint.

10. The method of claim 1, wherein a portion of the outer area that is irradiated to secure the first and second substrate layers together is at least ten times (10×) an area of the perimeter seal.

11. The method of claim 1, wherein directing the radiation along the predetermined path to form the perimeter seal and directing the radiation onto the outer area are performed sequentially during a single radiation session in which the radiation is continuously applied, wherein directing the radiation onto the outer area includes directing a laser beam in a raster-like manner to cover the outer area.

12. A device, comprising:
a multi-layer stack including a substrate layer and a radiation-absorbing material disposed along the substrate layer, the multi-layer stack including a cavity therein having a designated liquid;
wherein the radiation-absorbing material and the substrate layer form a bonding interface therebetween, the bonding interface including a composite joint that secures the radiation-absorbing material and the substrate layer to each other, the composite joint including a perimeter seal that extends along the cavity and a field joint that surrounds the perimeter seal, the perimeter seal being positioned between the cavity and the field joint.

13. The device of claim 12, wherein the perimeter seal and the field joint have different makeups.

14. The device of claim 12, wherein remnants of the designated liquid exist along or within the composite joint, the perimeter seal being positioned between the remnants and the cavity.

15. The device of claim 12 wherein the substrate layer is a first substrate layer, wherein the device further comprises a second substrate layer, and wherein the first substrate layer, the radiation-absorbing material, and the second substrate layer are continuous layers such that the device is devoid of ports that would permit flow of the designated liquid into or out of the cavity.

16. The device of claim 15, further comprising a target layer along at least one of the first substrate layer or the second substrate layer, the target layer including an opaque material located thereon in a designated pattern.

17. The device of claim 16, wherein the designated liquid includes a material that emits light when excited by a light source.

18. The device of claim 15, wherein the second substrate layer comprises a flexible membrane and the device further comprises an actuator that is operably positioned within or adjacent to the cavity, wherein the actuator is configured to be activated and deactivated to change pressure within the cavity and move the flexible membrane.

19. The device of claim 12, wherein the cavity includes a designated imaging region and a gutter region that exists between the designated imaging region and the radiation-absorbing material, the designated imaging region having a target to be imaged and the gutter region being devoid of the target.

20. A device, comprising:
a substrate layer;
a flexible membrane comprising a radiation-absorbing material, the radiation-absorbing material being disposed along the substrate layer, the flexible membrane and the substrate layer defining a cavity there between and having a designated liquid therein; and
an actuator operably positioned within or adjacent to the cavity;
wherein the radiation-absorbing material forms a composite joint that secures the substrate layer and the flexible membrane to each other, the composite joint including a perimeter seal that surrounds the cavity and a field joint that surrounds the perimeter seal, wherein the actuator is configured to be activated and deactivated to change pressure within the cavity and move the flexible membrane.

21. The device of claim 20, wherein the actuator, the designated liquid within the cavity, and the flexible membrane collectively operate as a liquid lens or a fluidic valve.

22. The device of claim 20, wherein the actuator includes at least one of an electrode, a piezoelectric material, or a resistive heater, or is configured to be modulated by light.

* * * * *